(12) United States Patent
Kurose et al.

(10) Patent No.: US 11,609,814 B2
(45) Date of Patent: *Mar. 21, 2023

(54) MEMORY SYSTEM

(71) Applicant: KIOXIA CORPORATION, Tokyo (JP)

(72) Inventors: Kengo Kurose, Suginami Tokyo (JP); Masanobu Shirakawa, Chigasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/387,890

(22) Filed: Jul. 28, 2021

(65) Prior Publication Data

US 2021/0357289 A1   Nov. 18, 2021

Related U.S. Application Data

(63) Continuation of application No. 16/802,521, filed on Feb. 26, 2020, now Pat. No. 11,099,931.

(30) Foreign Application Priority Data

Jun. 28, 2019   (JP) ............................. JP2019-121176

(51) Int. Cl.
| | |
|---|---|
| *G06F 11/10* | (2006.01) |
| *G11C 29/52* | (2006.01) |
| *G11C 29/04* | (2006.01) |
| *H04L 1/00* | (2006.01) |
| *H03M 13/00* | (2006.01) |
| *H03M 13/11* | (2006.01) |
| *G11C 16/26* | (2006.01) |

(Continued)

(52) U.S. Cl.
CPC ...... *G06F 11/1068* (2013.01); *G11C 11/5642* (2013.01); *G11C 16/0483* (2013.01); *G11C 16/26* (2013.01)

(58) Field of Classification Search
CPC .............. G11C 16/0483; G11C 29/028; G11C 11/5642; G11C 16/26; G11C 29/021; G06F 11/1068
See application file for complete search history.

(56) References Cited

U.S. PATENT DOCUMENTS

| | | | |
|---|---|---|---|
| 11,099,931 B2* | 8/2021 | Kurose | ............... G06F 11/1068 |
| 2009/0073760 A1* | 3/2009 | Betser | ................ G11C 16/3418 |
| | | | 365/185.18 |

(Continued)

*Primary Examiner* — Guy J Lamarre
(74) *Attorney, Agent, or Firm* — Kim & Stewart LLP

(57) ABSTRACT

A memory system includes a semiconductor storage device and a memory controller including a storage circuit that stores correction value for read voltages in association with the word line, and a control circuit that reads data from the memory cells, performs a correction operation on the read data to determine a number of error bits therein, determines the correction value for each read voltage based on the number of error bits and a ratio of a lower tail fail bit count and an upper tail fail bit count, and stores the correction values for the read voltages in the storage circuit. The lower tail fail bit count represents the number of memory cells in a first state having threshold voltages of an adjacent state, and the upper tail fail bit count represents the number of memory cells in the adjacent state having threshold voltages of the first state.

20 Claims, 23 Drawing Sheets

(51) Int. Cl.
    *G11C 16/34*     (2006.01)
    *G11C 16/04*     (2006.01)
    *G11C 11/56*     (2006.01)

(56)     References Cited

U.S. PATENT DOCUMENTS

| | | | |
|---|---|---|---|
| 2009/0116288 A1* | 5/2009 | Varkony | G11C 7/02 |
| | | | 365/230.02 |
| 2009/0201726 A1* | 8/2009 | Honma | G06F 11/1072 |
| | | | 365/185.18 |
| 2009/0228739 A1* | 9/2009 | Cohen | G11C 16/0475 |
| | | | 711/E12.001 |
| 2012/0096323 A1 | 4/2012 | Tachibana | |
| 2012/0155186 A1* | 6/2012 | Chokan | G11C 16/3459 |
| | | | 365/185.22 |
| 2013/0332801 A1* | 12/2013 | Weng | G06F 11/1008 |
| | | | 714/773 |
| 2017/0125114 A1 | 5/2017 | Alhussien et al. | |
| 2017/0229186 A1 | 8/2017 | Karakulak et al. | |
| 2018/0107540 A1* | 4/2018 | Lee | G11C 29/52 |
| 2019/0294367 A1* | 9/2019 | Takada | G11C 16/28 |
| 2020/0090763 A1 | 3/2020 | Tokutomi et al. | |

\* cited by examiner

FIG. 8
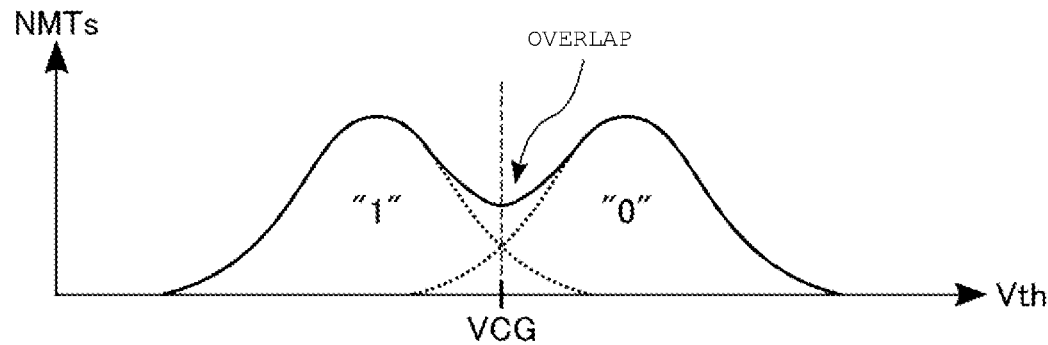
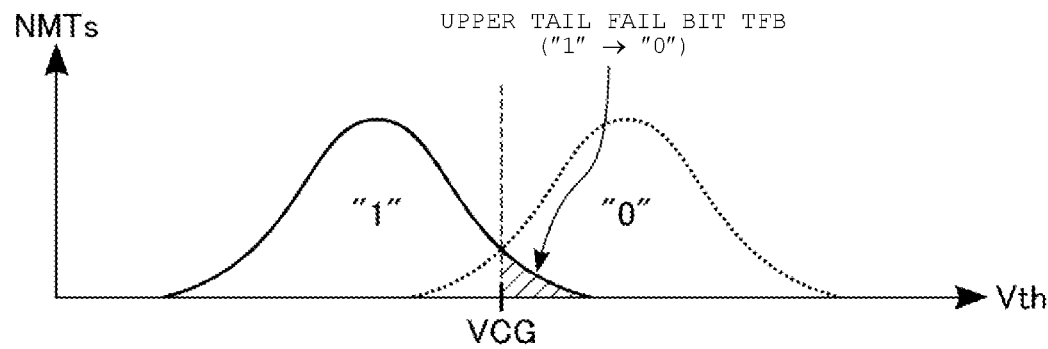
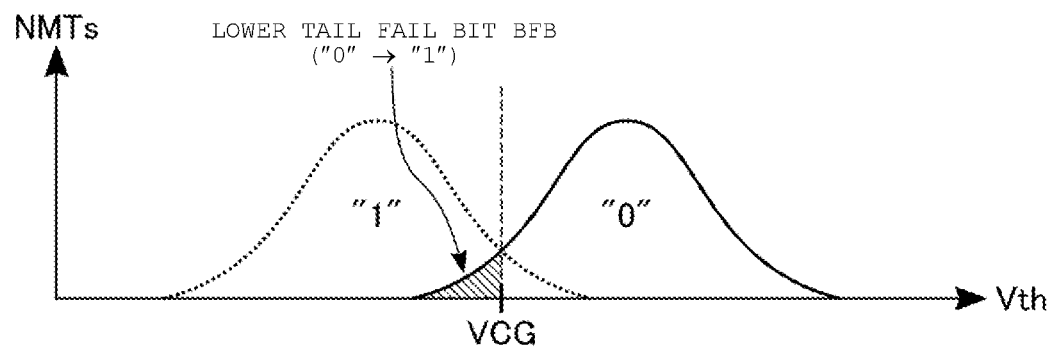

FIG. 9

| FAIL BIT COUNT (FBC) (=BFBC+TFBC) || FAIL RATIO (RAT) (=BFBC/TFBC) | SHIFT AMOUNT (DAC) |
| --- | --- | --- | --- |
| LOWER TAIL FAIL BIT COUNT (BFBC) | UPPER TAIL FAIL BIT COUNT (TFBC) | | |
| 10 | 100 | 0.1 | +5 |
| 30 | 60 | 0.5 | +3 |
| 40 | 40 | 1 | 0 |
| 60 | 30 | 2 | −3 |
| 100 | 10 | 10 | −5 |

FIG. 10

| CHIP ID | BLK | SU | WL | CORRECTION VALUE COL | | |
|---|---|---|---|---|---|---|
| | | | | AR | BR | CR |
| 0 | 0 | 0 | 0 | +6 | +1 | -5 |
| 0 | 0 | 0 | 1 | +4 | 0 | -3 |
| 0 | 0 | 0 | 2 | +3 | -1 | -3 |
| 0 | 0 | 0 | 3 | +4 | -1 | -6 |
| 0 | 0 | 0 | 4 | 0 | 0 | 0 |
| 0 | 0 | 0 | 5 | 0 | 0 | 0 |
| 0 | 0 | 0 | 6 | 0 | 0 | 0 |
| 0 | 0 | 0 | 7 | 0 | 0 | 0 |
| 0 | 0 | 1 | 0 | 0 | 0 | 0 |
| 0 | 0 | 1 | 1 | 0 | 0 | 0 |
| ⋮ | ⋮ | ⋮ | ⋮ | ⋮ | ⋮ | ⋮ |
| ⋮ | ⋮ | ⋮ | ⋮ | ⋮ | ⋮ | ⋮ |
| 0 | 0 | 3 | 6 | 0 | 0 | 0 |
| 0 | 0 | 3 | 7 | 0 | 0 | 0 |
| 0 | 1 | 0 | 0 | 0 | 0 | 0 |
| 0 | 1 | 0 | 1 | 0 | 0 | 0 |
| ⋮ | ⋮ | ⋮ | ⋮ | ⋮ | ⋮ | ⋮ |
| ⋮ | ⋮ | ⋮ | ⋮ | ⋮ | ⋮ | ⋮ |
| 0 | n | 3 | 6 | 0 | 0 | 0 |
| 0 | n | 3 | 7 | 0 | 0 | 0 |
| 1 | 0 | 0 | 0 | 0 | 0 | 0 |
| 1 | 0 | 0 | 1 | 0 | 0 | 0 |
| ⋮ | ⋮ | ⋮ | ⋮ | ⋮ | ⋮ | ⋮ |
| ⋮ | ⋮ | ⋮ | ⋮ | ⋮ | ⋮ | ⋮ |
| 1 | n | 3 | 6 | 0 | 0 | 0 |
| 1 | n | 3 | 7 | 0 | 0 | 0 |

FIG. 12

CORRECTION OPERATION: UPPER PAGE (STANDARD: FBC < 30 or 0.7 < RAT < 1.5)

(a) FIRST READ RESULT

| READ VOLTAGE | AR | CR |
|---|---|---|
| CORRECTION VALUE COL | 0 | 0 |
| FAIL BIT COUNT FBC | 60 | 80 |
| FAIL RATIO RAT | 0.5 | 2 |

↓ +2DAC      ↓ −5DAC (b) SECOND READ RESULT

| READ VOLTAGE | AR | CR |
|---|---|---|
| CORRECTION VALUE COL | +2 | −5 |
| FAIL BIT COUNT FBC | 25 | 50 |
| FAIL RATIO RAT | 0.8 | 0.5 |

"A" PASS

↓ +1DAC      ↓ +3DAC (c) THIRD READ RESULT

| READ VOLTAGE | AR | CR |
|---|---|---|
| CORRECTION VALUE COL | +3 | −2 |
| FAIL BIT COUNT FBC | 20 | 40 |
| FAIL RATIO RAT | 1 | 1.2 |

"C" PASS   ↓ −1DAC (d) CORRECTED READ VOLTAGE

| READ VOLTAGE | AR | CR |
|---|---|---|
| CORRECTION VALUE COL | +3 | −3 |

FIG. 14

| FAIL BIT COUNT FBC | | | CORRECTION VALUE COL | | | STRESS STATE |
|---|---|---|---|---|---|---|
| AR | BR | CR | AR | BR | CR | |
| SMALL | SMALL | SMALL | 0 | 0 | 0 | FIRST STATE (SHORTLY AFTER WRITE) |
| LARGE | MEDIUM | MEDIUM | +LARGE | +SMALL | +SMALL | SECOND STATE (RD INFLUENCE IS LARGE) |
| MEDIUM | MEDIUM | LARGE | −SMALL | −SMALL | −LARGE | THIRD STATE (DR INFLUENCE IS LARGE) |
| LARGE | MEDIUM | LARGE | +MEDIUM | 0 | −MEDIUM | FOURTH STATE (RD & DR INFLUENCES ARE LARGE) |
| MEDIUM | MEDIUM | MEDIUM | 0 | 0 | 0 | FIFTH STATE (CELL WEAR IS LARGE) |

FIG. 15

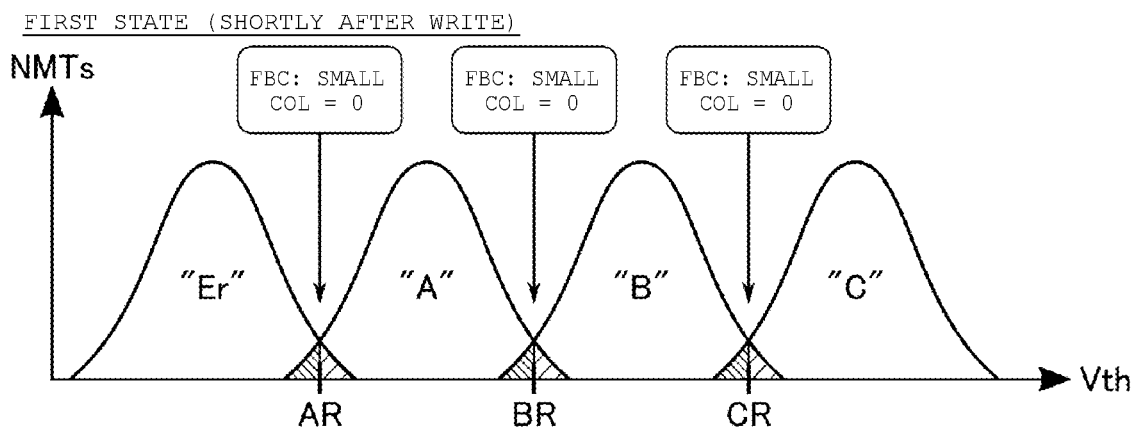

FIG. 21

| CHIP ID | BLK | SU | WL | STRESS INFORMATION |
|---|---|---|---|---|
| 0 | 0 | 0 | 0 | 4 (FOURTH STATE) |
| 0 | 0 | 0 | 1 | 4 (FOURTH STATE) |
| 0 | 0 | 0 | 2 | 4 (FOURTH STATE) |
| 0 | 0 | 0 | 3 | 4 (FOURTH STATE) |
| 0 | 0 | 0 | 4 | 4 (FOURTH STATE) |
| 0 | 0 | 0 | 5 | 4 (FOURTH STATE) |
| 0 | 0 | 0 | 6 | 4 (FOURTH STATE) |
| 0 | 0 | 0 | 7 | 4 (FOURTH STATE) |
| 0 | 0 | 1 | 0 | 2 (SECOND STATE) |
| 0 | 0 | 1 | 1 | 2 (SECOND STATE) |
| ⋮ | ⋮ | ⋮ | ⋮ | |
| ⋮ | ⋮ | ⋮ | ⋮ | |
| 0 | 0 | 3 | 6 | 2 (SECOND STATE) |
| 0 | 0 | 3 | 7 | 2 (SECOND STATE) |
| 0 | 1 | 0 | 0 | 5 (FIFTH STATE) |
| 0 | 1 | 0 | 1 | 5 (FIFTH STATE) |
| ⋮ | ⋮ | ⋮ | ⋮ | |
| ⋮ | ⋮ | ⋮ | ⋮ | |
| 0 | n | 3 | 6 | 3 (THIRD STATE) |
| 0 | n | 3 | 7 | 3 (THIRD STATE) |
| 1 | 0 | 0 | 0 | 2 (SECOND STATE) |
| 1 | 0 | 0 | 1 | 2 (SECOND STATE) |
| ⋮ | ⋮ | ⋮ | ⋮ | |
| ⋮ | ⋮ | ⋮ | ⋮ | |
| 1 | n | 3 | 6 | 1 (FIRST STATE) |
| 1 | n | 3 | 7 | 1 (FIRST STATE) |

| STRESS STATE | SHIFT AMOUNT OF READ VOLTAGE (DAC) | | | | | | LLR TABLE |
| --- | --- | --- | --- | --- | --- | --- | --- |
| | AR | | BR | | CR | | |
| | $\Delta$AM | $\Delta$AP | $\Delta$BM | $\Delta$BP | $\Delta$CM | $\Delta$CP | |
| FIRST STATE | 3 | 3 | 3 | 3 | 3 | 3 | LLR TABLE 0 |
| SECOND STATE | 3 | 5 | 3 | 3 | 3 | 3 | LLR TABLE 1 |
| THIRD STATE | 3 | 3 | 3 | 3 | 5 | 3 | LLR TABLE 2 |
| FOURTH STATE | 3 | 5 | 3 | 3 | 5 | 3 | LLR TABLE 3 |
| FIFTH STATE | 4 | 4 | 4 | 4 | 4 | 4 | LLR TABLE 4 |
| ⋮ | ⋮ | ⋮ | ⋮ | ⋮ | ⋮ | ⋮ | ⋮ |

ONE EXAMPLE OF SHIFT AMOUNT OF READ VOLTAGE IN SOFT BIT READ OPERATION (LLR TABLE 0)

MEMORY SYSTEM

CROSS-REFERENCE TO RELATED APPLICATION

This application is a continuation of U.S. patent application Ser. No. 16/802,521, filed Feb. 26, 2020, which is based upon and claims the benefit of priority from Japanese Patent Application No. 2019-121176, filed Jun. 28, 2019, the entire contents of which are incorporated herein by reference.

FIELD

Embodiments described herein relate generally to a memory system.

BACKGROUND

A NAND flash memory capable of storing data in a nonvolatile manner is known.

DESCRIPTION OF THE DRAWINGS

FIG. 8 is a threshold voltage distribution diagram illustrating an example of a fail bit between two adjacent states in the memory system according to the first embodiment.

FIG. 9 is a table used in setting a shift amount of a read voltage in the correction operation of the memory system according to the first embodiment.

FIG. 10 is a table illustrating an example of a correction value table in the memory system according to the first embodiment.

FIG. 12 changes in a correction value of the read voltage, fail bit counts, and fail ratio in the correction operation of the memory system according to the first embodiment.

FIG. 14 is a table illustrating an example stress states in the memory system as a result of the correction operation carried out according to the first embodiment.

FIG. 15 is a threshold voltage distribution diagram illustrating an example of a threshold voltage distribution of a first state in the memory system according to the first embodiment.

FIG. 21 is a table illustrating an example of a stress information table in the memory system according to the second embodiment.

DETAILED DESCRIPTION

Figure 1:
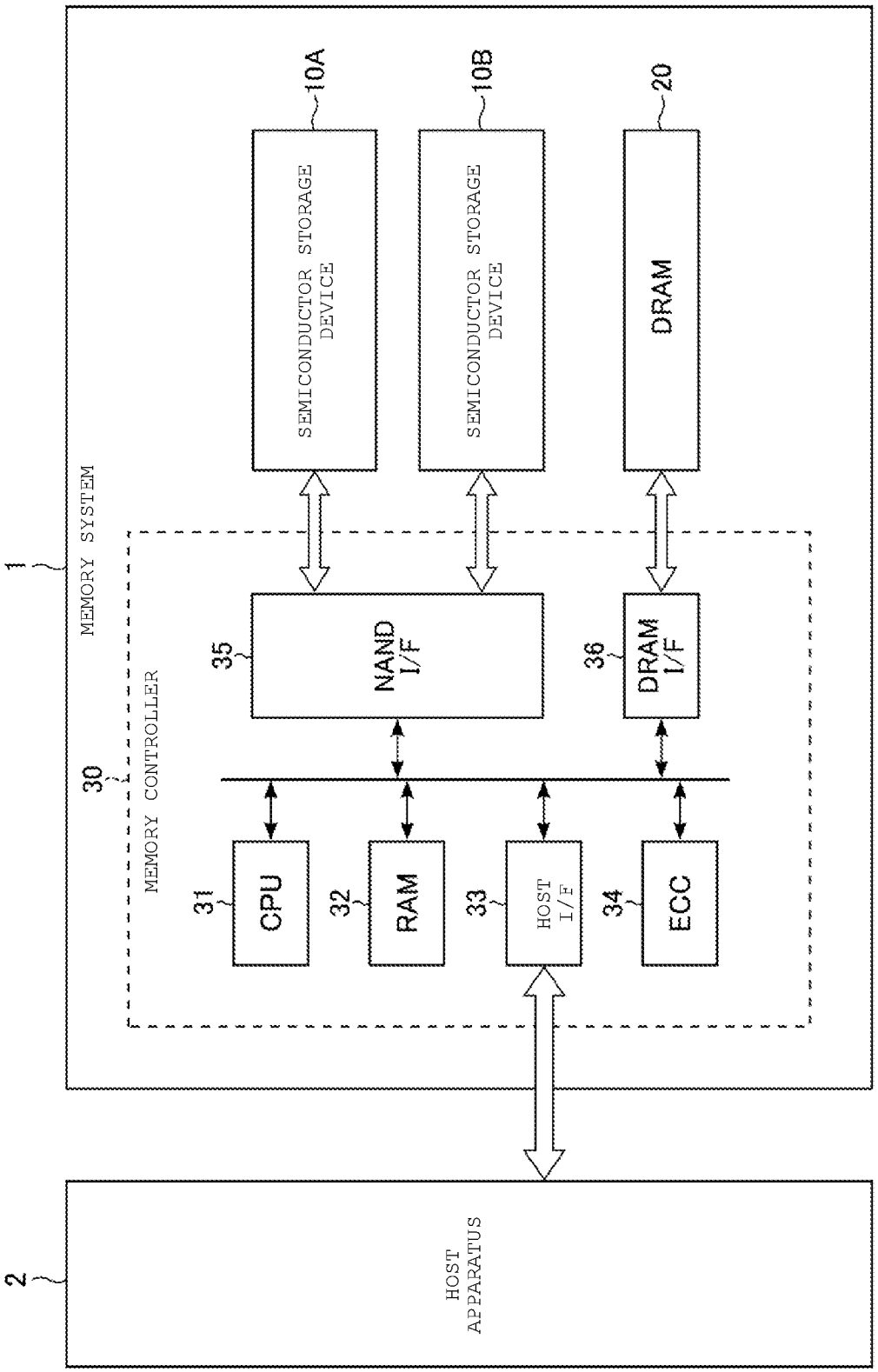
FIG. 1 is a block diagram illustrating a configuration example of a memory system according to a first embodiment.

Embodiments provide a memory system that increases reliability of data read from a semiconductor storage device.

In general, a memory system according to one embodiment includes a semiconductor storage device and a memory controller. The semiconductor storage device includes a plurality of memory cells each storing a plurality of bits of data and a word line connected to the plurality of memory cells. The memory controller includes a storage circuit and a control circuit. The storage circuit stores correction values for read voltages in association with the word line. The control circuit selects the word line and read data from the memory cells, performs a correction operation on the read data to determine a number of error bits in the data, determines the correction value for each read voltage based on the number of error bits in the data that has been read using the read voltage and a ratio of a lower tail fail bit count and an upper tail fail bit count in the data that has been read using the read voltage, and stores the correction values for the read voltages in the storage circuit for subsequent read operations performed on the memory cells. The lower tail fail bit count represents the number of memory cells in a first state having threshold voltages of a second state that is adjacent to the first state, and the upper tail fail bit count represents the number of memory cells in the second state having threshold voltages of the first state.

Hereinafter, embodiments will be described with reference to the drawings. Each embodiment exemplifies a device and a method for embodying the technical idea of the disclosure. The drawings are schematic or conceptual, and a dimension and a ratio of each drawing are not necessarily the same as actual ones.

In the following description, configuration elements having substantially the same function and configuration are denoted by the same reference numerals. A number after a character that make up a reference sign for elements having the same configuration is used to distinguish between such elements. Likewise, a character after a number that make up a reference sign for elements having the same configuration is used to distinguish between such elements. When it is not necessary to distinguish between the elements indicated by the same reference sign, each of the elements is referenced by a reference sign including only a character or a number.

1. First Embodiment

A memory system 1 according to a first embodiment is, for example, a solid state drive (SSD), and can store data in a nonvolatile manner. The memory system 1 according to the first embodiment will be described below.
1-1 Configuration
1-1-1 Overall Configuration of Memory System 1

FIG. 1 illustrates a configuration example of the memory system 1 according to the first embodiment. As illustrated in FIG. 1, the memory system 1 according to the first embodiment is connected to an external host apparatus and can perform various operations in response to a command from the host apparatus 2. The memory system 1 according to the first embodiment includes, for example, semiconductor storage devices 10A and 10B, a dynamic random access memory (DRAM) 20, and a memory controller 30.

Each of the semiconductor storage devices 10A and 10B is a NAND flash memory that stores data in a nonvolatile manner. The number of semiconductor storage devices 10 in the memory system 1 may be any number. A detailed configuration of the semiconductor storage device 10 will be described below.

The DRAM 20 is a volatile memory used as a storage region of the memory controller 30. For example, the DRAM 20 temporarily stores write data received from the host apparatus 2. The DRAM 20 may be embedded in the memory controller 30, the host apparatus 2, or the like.

The memory controller 30 is, for example, a System on Chip (SoC), and commands each of the semiconductor storage devices 10A and 10B to perform read, write, erasure, and the like in response to a command from the host apparatus 2. The memory controller 30 includes, for example, a central processing unit (CPU) 31, a random access memory (RAM) 32, a host interface circuit 33, an error correction code (ECC) circuit 34, a NAND interface circuit 35, and a DRAM interface circuit 36.

The CPU 31 controls an overall operation of the memory controller 30. For example, the CPU 31 issues a write command in response to a write command received from the host apparatus 2 and issues a read command in response to a read command received from the host apparatus 2. The CPU 31 performs various processes for managing a memory space of the semiconductor storage device 10, such as patrol operation, and wear leveling. Details of the patrol operation will be described below.

The RAM 32 is a volatile memory such as a static random access memory (SRAM). The RAM 32 is used as a work region of the CPU 31, and stores, for example, firmware for managing the semiconductor storage device 10, various management tables, and the like.

The host interface circuit 33 is connected to the host apparatus 2 via a host bus, and controls transfer of data, a command, and an address between the memory controller 30 and the host apparatus 2. The host interface circuit 33 may support communication interface standards such as, a serial advanced technology attachment (SATA), a serial attached SCSI (SAS), and the PCI Express (PCIe)®.

The ECC circuit 34 performs an error correction process of data. At the time of a write operation, the ECC circuit 34 generates a parity based on the write data received from the host apparatus 2 and applies the generated parity to the write data. At the time of a read operation, the ECC circuit 34 generates a syndrome based on the read data received from the semiconductor storage device 10 and detects and corrects an error in the read data based on the generated syndrome.

The NAND interface circuit 35 can control transfer of data, a command, and an address between the memory controller 30 and the semiconductor storage device 10 and independently control the semiconductor storage devices 10A and 10B. The NAND interface circuit 35 supports a NAND interface standard.

The DRAM interface circuit 36 is connected to the DRAM 20 and manages communication between the memory controller 30 and the DRAM 20. The DRAM interface circuit 36 supports a DRAM interface standard.
1-1-2 Configuration of Semiconductor Storage Device 10

Figure 2:
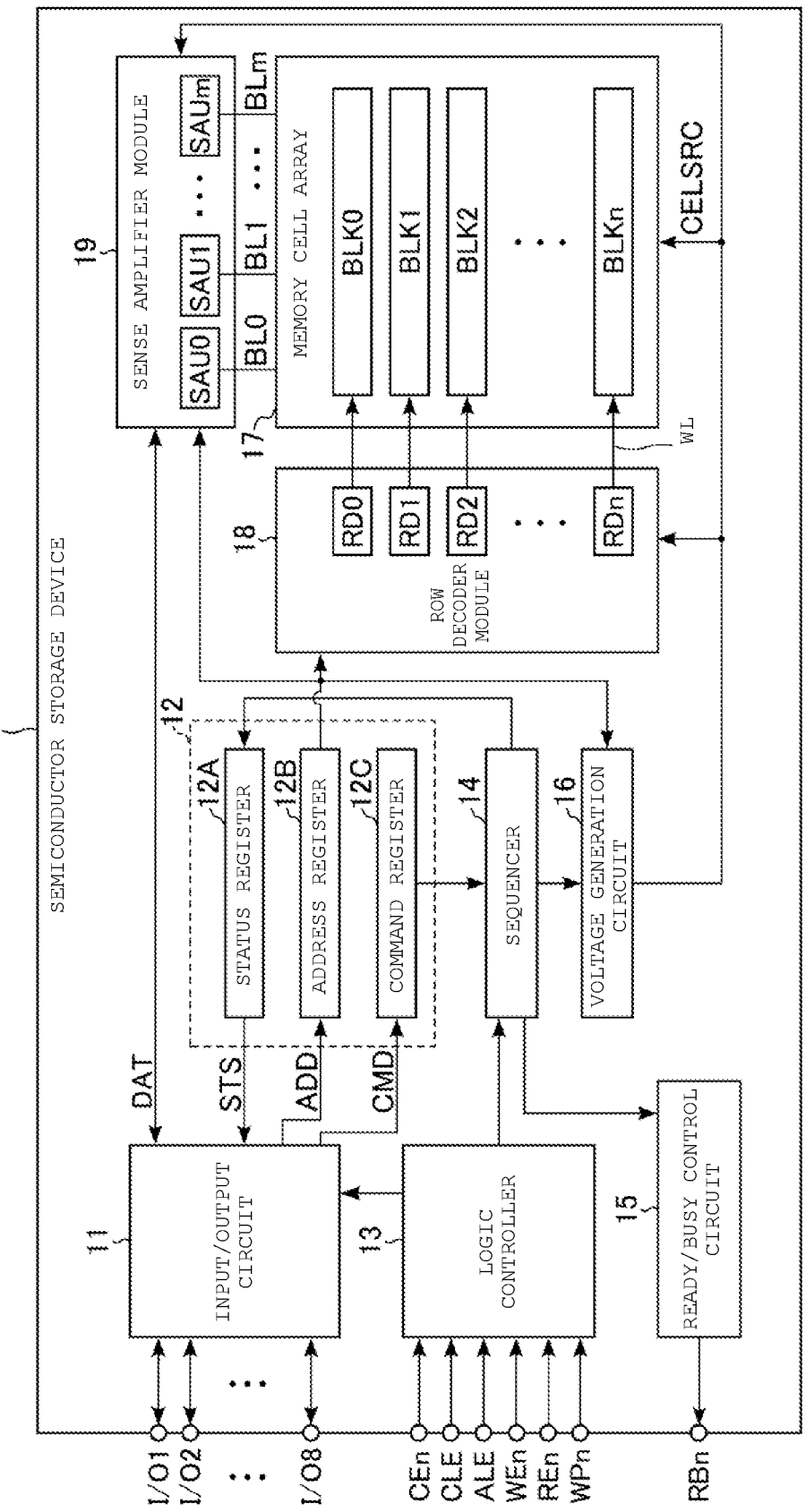
FIG. 2 is a block diagram illustrating a configuration example of a semiconductor storage device in the memory system according to the first embodiment.

FIG. 2 illustrates a configuration example of the semiconductor storage device 10 in the memory system 1 according to the first embodiment. As illustrated in FIG. 2, the semiconductor storage device 10 includes, for example, an input/output circuit 11, a register set 12, a logic controller 13, a sequencer 14, a ready/busy control circuit 15, a voltage generation circuit 16, a memory cell array 17, and a row decoder module 18, and a sense amplifier module 19.

The input/output circuit 11 transmits and receives, for example, input/output signals I/O1 to I/O8 having a total width of 8 bits to and from the memory controller 30. The input/output signals I/O may include data DAT, status information STS, address information ADD, a command CMD, and the like. The input/output circuit 11 transmits and receives the data DAT to and from the sense amplifier module 19.

The register set 12 includes a status register 12A, an address register 12B, and a command register 12C. The status register 12A, the address register 12B, and the command register 12C store the status information STS, the address information ADD, and the command CMD, respectively.

The status information STS is updated based on an operation state of, for example, the sequencer 14. The status information STS is transferred from the status register 12A to the input/output circuit 11 based on an instruction from the memory controller 30 and is output to the memory controller 30. The address information ADD can be transferred from the input/output circuit 11 to the address register 12B and include, for example, a block address, a page address, a column address, and the like. The command CMD is transferred from the input/output circuit to the command register 12C and includes commands regarding various operations of the semiconductor storage device 10.

The logic controller 13 controls each of the input/output circuit 11 and the sequencer 14, based on control signals received from the memory controller 30. For example, a chip enable signal CEn, a command latch enable signal CLE, an address latch enable signal ALE, a write enable signal WEn, a read enable signal REn, and a write protection signal WPn are used as the control signals.

The chip enable signal CEn is a signal for enabling the semiconductor storage device 10. The command latch enable signal CLE is a signal for notifying the input/output circuit 11 that the received input/output signal I/O is the command CMD. The address latch enable signal ALE is a signal for notifying the input/output circuit 11 that the received input/output signal I/O is the address information ADD. The write enable signal WEn is a signal for instructing the input/output circuit 11 to input the input/output signal I/O. The read enable signal REn is a signal for instructing the input/output circuit 11 to output the input/output signal I/O. The write protection signal WPn is a signal for making the semiconductor storage device 10 enter a protection state when power is turned on or off.

The sequencer 14 controls an overall operation of the semiconductor storage device 10. For example, the sequencer 14 performs a read operation, a write operation, an erasing operation, and the like, based on the command CMD stored in the command register 12C and the address information ADD stored in the address register 12B.

The ready/busy control circuit 15 generates a ready/busy signal RBn based on the operation state of the sequencer 14. The ready/busy signal RBn is a signal for notifying the memory controller 30 whether the semiconductor storage device 10 is in a ready state or in a busy state. In the present specification, the "ready state" indicates that the semiconductor storage device 10 is in a state capable of receiving a command from the memory controller, and the "busy state" indicates that the semiconductor storage device 10 is in a state not being capable of receiving a command from the memory controller.

The voltage generation circuit 16 generates a voltage used in the read operation, the write operation, the erasing operation, and the like. The voltage generation circuit 16 supplies the generated voltage to the memory cell array 17, the row decoder module 18, and the sense amplifier module 19.

The memory cell array 17 includes a plurality of blocks BLK0 to BLKn (n is an integer larger than or equal to 1). The block BLK is a set of a plurality of memory cell transistors capable of storing data in a nonvolatile manner and is used as, for example, a data erasure unit. The memory cell array 17 includes a plurality of bit lines BL0 to BLm (m is an integer larger than or equal to 1), a plurality of word lines WL, a source line CELSRC, and a well line. For example, a voltage generation circuit 16 applies a voltage to the source line CELSRC. Each memory cell transistor is associated with 1-bit line BL and one word line WL. A detailed circuit configuration of the memory cell array 17 will be described below.

The row decoder module 18 selects the block BLK which performs various operations, based on the block address. The row decoder module 18 transfers a voltage supplied from the voltage generation circuit 16 to various wires in the selected block BLK. The row decoder module 18 includes, for example, a plurality of row decoders RD0 to RDn. The row decoders RD0 to RDn are associated with the blocks BLK0 to BLKn, respectively.

The sense amplifier module 19 reads data from the memory cell array 17 and transfers the read data to the input/output circuit 11 in the read operation. The sense amplifier module 19 applies a desirable voltage to the bit line BL based on the data received from the input/output circuit 11 in the write operation. For example, the sense amplifier module 19 includes a plurality of sense amplifier units SAU0 to SAUm. The sense amplifier units SAU0 to SAUm are associated with the bit lines BL0 to BLm, respectively.

Circuit Configuration of Memory Cell Array 17

Figure 3:
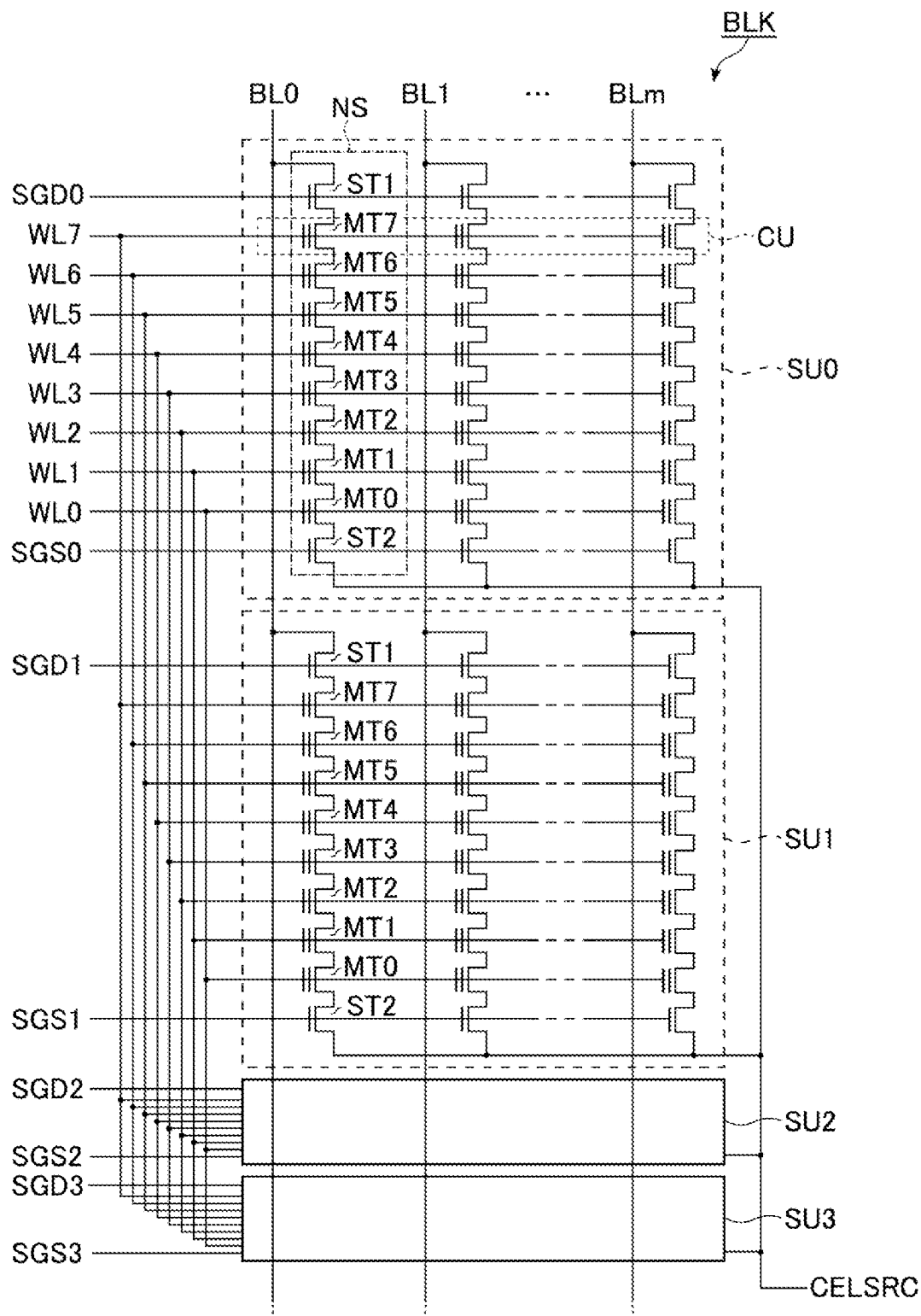
FIG. 3 is a circuit diagram illustrating an example of a circuit configuration of a memory cell array in the semiconductor storage device in the memory system according to the first embodiment.

FIG. 3 is an example of a circuit configuration of the memory cell array 17 in the semiconductor storage device 10 in the memory system 1 according to the first embodiment and illustrates extracted one block BLK. As illustrated in FIG. 3, the block BLK includes, for example, four string units SU0 to SU3.

Each string unit SU includes a plurality of NAND strings NS respectively associated with the bit lines BL0 to BLm. The NAND string NS includes, for example, memory cell transistors MT0 to MT7, and select transistors ST1 and ST2.

The memory cell transistor MT includes a control gate and a charge storage layer and stores data in a nonvolatile manner. Each of the select transistors ST1 and ST2 is used to select a string unit SU in various operations.

In each NAND string NS, the memory cell transistors MT0 to MT7 are connected in series. The select transistor ST1 is connected between one end of the memory cell transistors MT0 to MT7 connected in series and the associated bit line BL. A drain of the select transistor ST2 is connected to the other end of the memory cell transistors MT0 to MT7 connected in series. The source line CELSRC and the well line CPWELL (not illustrated) are connected to a source of the select transistor ST2.

In the same block BLK, gates of the plurality of select transistors ST1 in each of the string units SU0 to SU3 are commonly connected to the select gate lines SGD0 to SGD3, respectively. Control gates of the plurality of memory cell transistors MT0 to MT7 are commonly connected to the word lines WL0 to WL7, respectively. The respective gates of the plurality of select transistors ST2 in the string units SU0 to SU3 are commonly connected to the select gate lines SGS0 to SGS3, respectively.

The bit lines BL0 to BLm are shared among the plurality of blocks BLK. The common bit line BL is connected to the select transistors ST1 in the NAND strings NS corresponding to the same column address. The respective word lines WL0 to WL7 are provided for each block BLK. Each of the source line CELSRC and the well line CPWELL (not illustrated) is shared among, for example, the plurality of blocks BLK.

A set of a plurality of memory cell transistors MT connected to the common word line WL in one string unit SU is referred to as, for example, a cell unit CU. For example, a storage capacity of the cell unit CU including the memory cell transistors MT, each storing 1-bit data, is defined as "1-page data". The cell unit CU has a storage capacity of two or more page data according to the number of bits of data stored in the memory cell transistors MT.

Further, the circuit configuration of the memory cell array 17 described above is an example and the embodiment is not limited to this. For example, the number of string units SU in each block BLK may be any number. The number of memory cell transistors MT and select transistors ST1 and ST2 in each NAND string NS may be any number.

Circuit Configuration of Sense Amplifier Module 19

Figure 4:
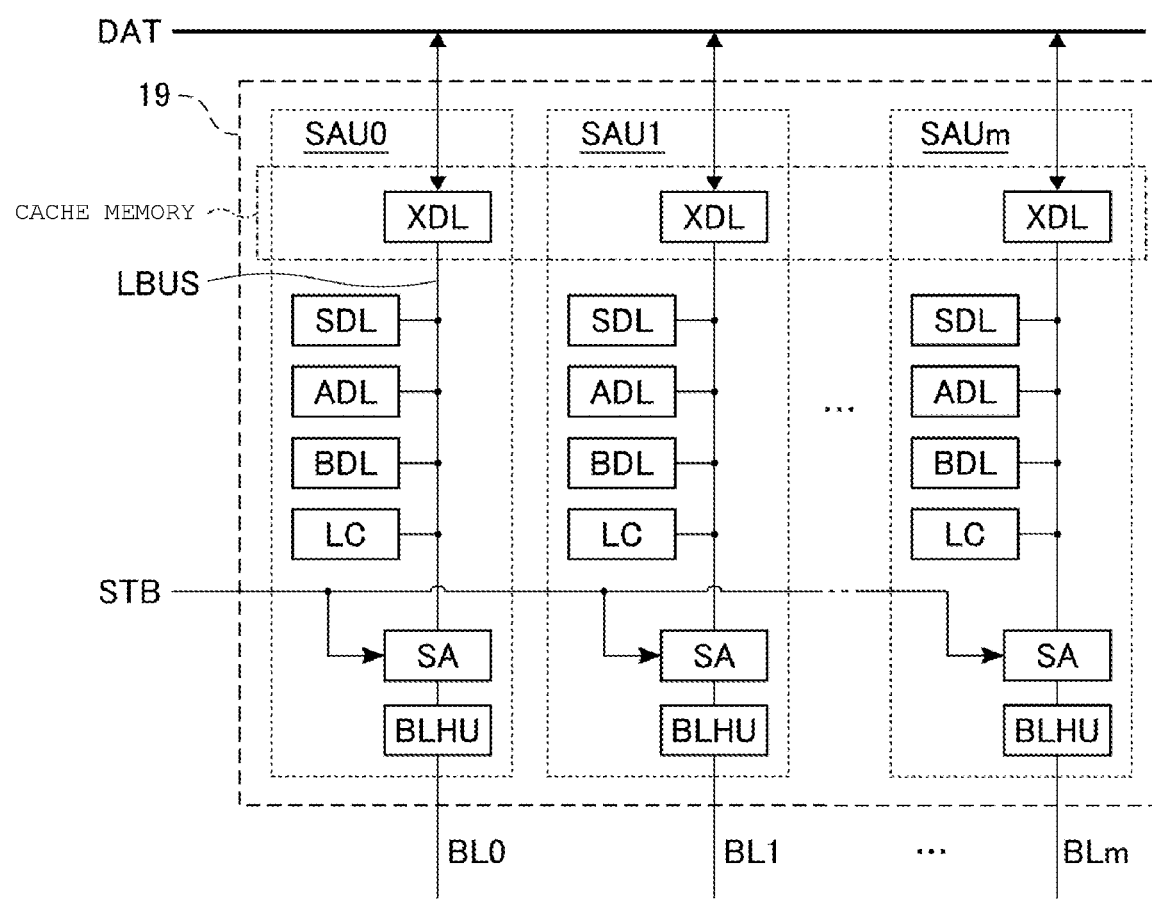
FIG. 4 is a circuit diagram illustrating an example of a circuit configuration of a sense amplifier module in the semiconductor storage device in the memory system according to the first embodiment.

FIG. 4 illustrates an example of a circuit configuration of the sense amplifier module 19 in the semiconductor storage device 10 in the memory system 1 according to the first embodiment. As illustrated in FIG. 4, each sense amplifier unit SAU includes, for example, a bit line connection unit BLHU, a sense amplifier portion SA, a logic circuit LC, and latch circuits SDL, ADL, BDL, and XDL.

The bit line connection unit BLHU includes a high breakdown voltage transistor connected between the associated bit line BL and the sense amplifier portion SA. The sense amplifier SA, the logic circuit LC, and the latch circuits SDL, ADL, BDL, and XDL are commonly connected to the bus LBUS. The latch circuits SDL, ADL, BDL, and XDL can transmit and receive data to and from each other.

For example, a control signal STB generated by the sequencer 14 is input to each sense amplifier portion SA. Then, the sense amplifier portion SA determines whether data read to the associated bit line BL is "0" or "1" based on timing when the control signal STB is asserted. That is, the sense amplifier portion SA determines data stored in the selected memory cell based on a voltage of the bit line BL.

The logic circuit LC performs various logic operations by using data stored in the latch circuits SDL, ADL, BDL and XDL connected to the common bus LBUS. Specifically, the logic circuit LC can perform an AND operation, an OR operation, a NAND operation, a NOR operation, an EXNOR operation, and the like by using the data stored in the two latch circuits.

Each of the latch circuits SDL, ADL, BDL, and XDL temporarily stores data. The latch circuit XDL is used for input and output of data DAT between the sense amplifier unit SAU and the input/output circuit 11. The latch circuit XDL may be used as, for example, a cache memory of the semiconductor storage device 10. The semiconductor storage device 10 is in a ready state if at least the latch circuit XDL is free.

The circuit configuration of the sense amplifier module 19 described above is an example, and the present disclosure is not limited to this. For example, the number of latch circuits in each sense amplifier unit SAU can be appropriately changed based on the number of pages stored in one cell unit CU. The logic circuit LC may be omitted as long as the logic operation can be performed only by the latch circuit.

1-1-3 Data Storage Method

Figure 5:
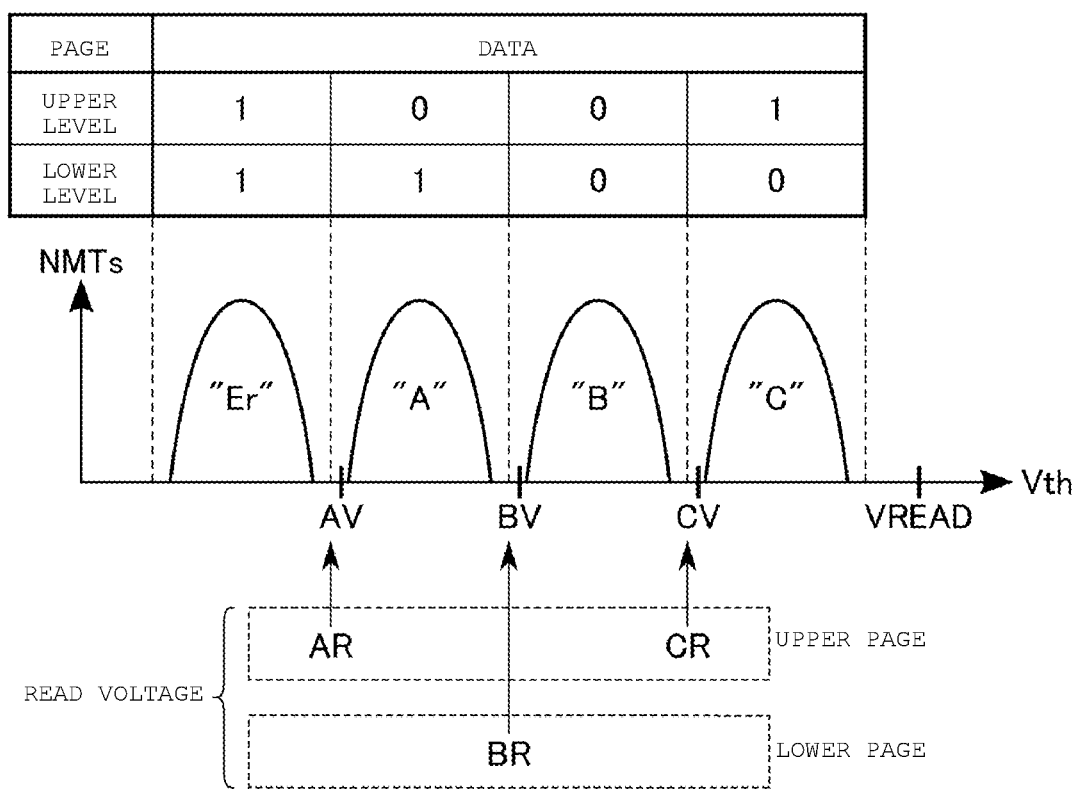
FIG. 5 is a threshold voltage distribution diagram illustrating an example of a threshold voltage distribution of memory cell transistors of the memory system according to the first embodiment.

FIG. 5 illustrates an example of a threshold voltage distribution, a read voltage, and a verify voltage of the memory cell transistor MT of the memory system 1 according to the first embodiment. In a threshold voltage distribution diagram referred to below, a vertical axis NMTs corresponds to the number of memory cell transistors MT, and a horizontal axis Vth corresponds to a threshold voltage of the memory cell transistor MT.

As illustrated in FIG. 5, in the memory system 1 according to the first embodiment, four types of threshold voltage distributions are formed by the plurality of memory cell transistors MT. For example, the four types of threshold voltage distributions are referred to as an "Er" state, an "A" state, a "B" state, and a "C" state, respectively, in order from the lowest threshold voltage. The "Er" state corresponds to an erasure state of the memory cell transistor MT. Each of the "A" state, the "B" state, and the "C" state corresponds to a state in which data is written to the memory cell transistor MT.

Different 2-bit data is assigned to each of the "Er" state, "A" state, "B" state, and "C" state, and only 1-bit data is set to be different between two adjacent states. As such, a method of storing 2-bit data in one memory cell transistor is referred to as, for example, a multi-level cell (MLC) method. An example of data allocation for the four types of threshold voltage distribution will be listed below.

"Er" state: "11 (upper bit/lower bit)" data
"A" state: "01" data
"B" state: "00" data
"C" state: "10" data The verify voltage used for the write operation is set between adjacent states. Specifically, a verify voltage AV is set between the "Er" state and the "A" state, a verify voltage BV is set between the "A" state and the "B" state, and a verify voltage CV is set between the "B" state and the "C" state.

The verify voltages AV, BV, and CV are used for programming the "A" state, the "B" state, and the "C" state, respectively. In the write operation, if the semiconductor storage device 10 detects that the threshold voltage of the memory cell transistor MT storing certain data exceeds the verify voltage corresponding to the data, programming the memory cell transistor MT is completed.

A read voltage used for a read operation is set between adjacent states. Specifically, a read voltage AR is set between the "Er" state and the "A" state, a read voltage BR is set between the "A" state and the "B" state, and a read voltage CR is set between the "B" state and the "C" state. Further, a read pass voltage VREAD is set to a voltage higher than the "C" state.

The read voltages AR, BR, and CR are used for a distinction between the "Er" state and the "A" state and higher, a distinction between the "A" state and lower and the "B" state and higher, and a distinction between the "B" state and lower and the "C", respectively. The memory cell transistor MT to which the read pass voltage VREAD is applied to a gate thereof is turned on regardless of stored data. In the read operation, the semiconductor storage device 10 determines read data by determining a state in which the memory cell transistors MT are distributed by using the read voltage.

For example, when allocation of the data illustrated in FIG. 5 is applied, one page data (lower page data) configured with lower bits is determined by a read operation using the read voltage BR. One page data (upper page data) configured with upper bits is determined by a read operation using each of the read voltages AR and CR. In a page read operation in which a plurality of read voltages are used, the logic circuit LC appropriately performs an operation process.

The number of bits of the data stored in one memory cell transistor MT described above is an example, and the present disclosure is not limited to this. For example, data of 3 bits or more may be stored in the memory cell transistor MT. In the memory system 1, the number of threshold voltage distributions to be formed, the read voltage, the read pass voltage, the verify voltage, and the like may be appropriately set according to the number of bits stored in the memory cell transistor MT.

1-2 Operation

Next, an operation of the memory system 1 according to the first embodiment will be described. In the following description, the word line WL connected to the memory cell transistor MT corresponding to the selected page is referred to as a select word line WLsel. Application of a voltage to the word line WL corresponds to application of a voltage to the word line WL via the row decoder module 18 by using the voltage generation circuit 16.

1-2-1 Outline of Patrol Operation

The memory system 1 according to the first embodiment voluntarily performs a patrol operation during a period when an operation based on a command from the host apparatus 2 is not performed. In other words, the memory system 1 according to the first embodiment performs the patrol operation independently of the command from the host apparatus 2 during a background operation.

The patrol operation contributes to reduction of a read error in the memory system 1 and detection of the block BLK in which failure occurs. For example, in the patrol operation, the memory system 1 performs a patrol read and a correction operation for all pages in all the blocks BLK for each predetermined patrol period.

The patrol read is a read operation for checking whether or not a target page of the patrol operation can be read, and is performed with reference to a history table. The history table stores information indicating whether or not the patrol operation has been performed in the patrol period, for example, for each word line WL. The history table is stored in, for example, the RAM 32.

The correction operation is an operation for estimating an optimum read voltage based on the patrol read result and updating the correction value table. The correction value table stores a correction value of the read voltage referred to by the CPU 31 in the read operation, and is stored in, for example, the RAM 32.

In the above description, a case where the history table and the correction value table are stored in the RAM 32 is illustrated, but the present disclosure is not limited to this. The history table and the correction value table may be stored in at least a region that can be referred to by the CPU 31, and may be stored in, for example, the DRAM 20.

In the following description, the data obtained by the read voltage based on the correction value table is referred to as a hard bit, and the data obtained by the read voltage obtained by shifting a voltage from the read voltage used for reading the hard bit is referred to as a soft bit. An error correction process using the hard bit is referred to as a hard determination decoding process, and an error correction process using the hard bit and the soft bit is referred to as a soft determination decoding process.

Flow of Patrol Operation

Figure 6:
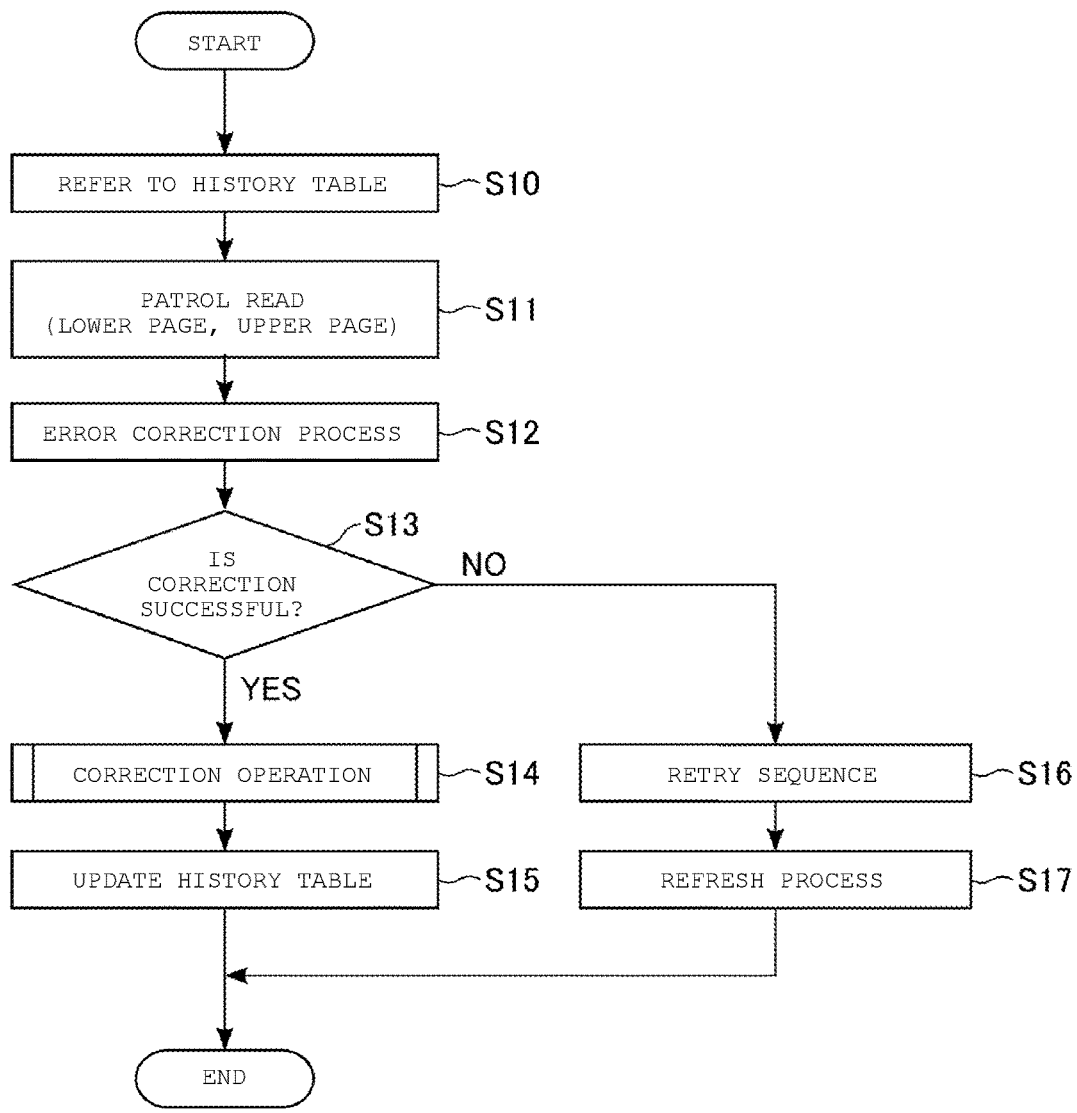
FIG. 6 is a flow chart illustrating an example of a patrol operation of the memory system according to the first embodiment.

FIG. 6 illustrates an example of a flow of the patrol operation of the memory system 1 according to the first embodiment. As illustrated in FIG. 6, if the patrol operation starts, the CPU 31 first checks a progress state of the patrol operation with reference to the history table (step S10).

Next, the CPU 31 performs a patrol read for the word line WL for which the patrol operation has not been performed, based on the checked progress state of the patrol operation (step S11). Specifically, in step S11, the CPU 31 causes the semiconductor storage device 10 to perform read operations of a lower page and an upper page. The read voltage based on the correction value table is used in the read operations.

Next, the CPU 31 causes the ECC circuit 34 to perform an error correction process for the received read result (step S12). The patrol read is a read operation using the read voltage based on the correction value table, and the error correction process in step S12 corresponds to the hard determination decoding process. If the error correction process by the ECC circuit 34 is completed, the CPU 31 checks whether or not the error correction is successful (step S13).

When the error correction is successful in step S13 (step S13, YES), the CPU 31 subsequently performs a correction operation (step S14). A detailed correction operation will be described below. If the correction operation is completed, the CPU 31 updates the history table based on a correction value of an optimum read voltage obtained by the correction operation (step S15). If updating the history table is completed, the CPU 31 ends the patrol operation of selecting the word line WL, and appropriately performs the patrol operation for a subsequent page.

If the error correction fails in step S13 (step S13, NO), the CPU 31 subsequently performs a retry sequence (step S16). In the retry sequence, for example, a shift read in which a predetermined correction is applied to the read voltage, tracking read in which an optimum read voltage is searched by multiple reads, the soft determination decoding process, and the like are performed. In the retry sequence, the operations may be performed a plurality of number of times until the error correction is successful, or a plurality of different types of read may be performed. For example, in the retry sequence, the CPU 31 may perform the shift read a plurality of number of times, may perform a tracking read a plurality of number of times, or may perform the tracking read after the shift read is performed.

If the error correctable data is read in the retry sequence, the CPU 31 subsequently performs a refresh process (step S17). The refresh process is a write operation for saving the data of a page on which the retry sequence is performed in the block BLK different from the page. If the refresh operation is completed, the CPU 31 ends the patrol operation of the selected word line WL and performs the patrol operation for a subsequent page.

The refresh operation may be performed at another timing. For example, the refresh operation can be performed on a block BLK basis. In this case, the data obtained by the retry sequence is stored in the DRAM 20 or the like, and after the patrol operation of all pages in the block BLK is completed, the refresh operation of the block BLK is performed in a batch.

1-2-2 Patrol Read

In the patrol read, all data stored in the memory cell transistors MT connected to the selected word line WL is read. The data may be read sequentially or may be read on a page basis. Accordingly, the number of times that the command is transmitted from the memory controller 30 to the semiconductor storage device 10 in the patrol read changes depending on the read method.

Figure 7:
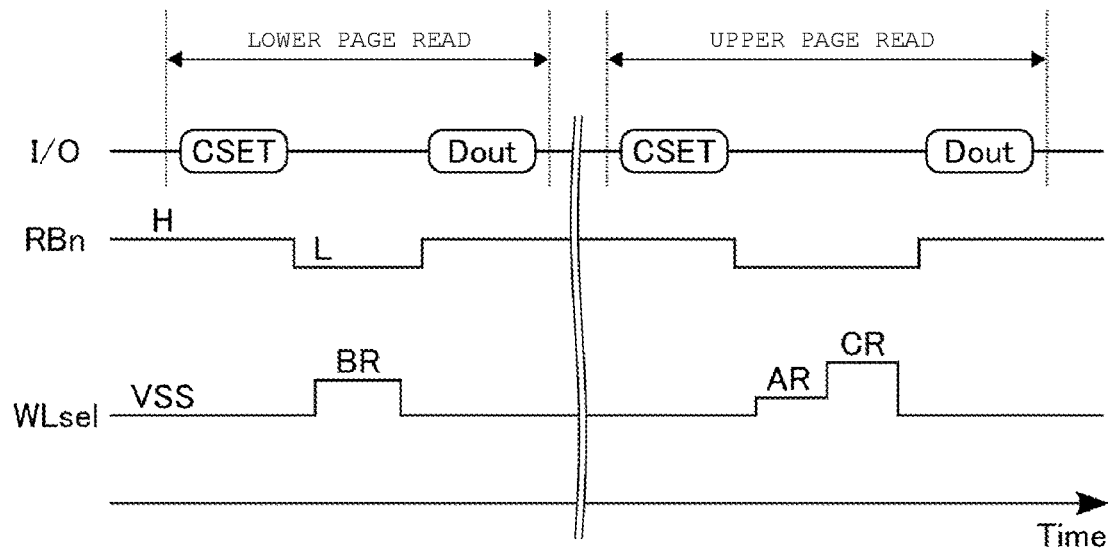
FIG. 7 is a timing chart illustrating an example of patrol reading of the memory system according to the first embodiment.

FIG. 7 illustrates an example of a read operation (lower page read) in which the lower page is selected and a read operation (upper page read) in which the upper page is selected when the patrol read of the memory system 1 according to the first embodiment is performed on page basis. FIG. 7 illustrates states of the input/output signal I/O, the ready/busy signal RBn, and the select word line WLsel. A voltage of an initial state of the ready/busy signal RBn is a "H" level, and a voltage of an initial state of the select word line WLsel is VSS. Hereinafter, a lower page read and an upper page read will be described sequentially with reference to FIG. 7.

Lower Page Read

The memory controller 30 transmits a command set CSET including address information ADD designating a lower page and a read command CMD to the semiconductor storage device 10. Then, the sequencer 14 changes the semiconductor storage device 10 from a ready state to a busy state (RBn="L" level), and starts a read operation based on the received command set CSET.

If the read operation by which the lower page is selected starts, the read voltage BR is applied to the select word line WLsel. Then, the sequencer 14 asserts the control signal STB while the read voltage BR is applied to the select word line WLsel and determines data corresponding to a voltage of the bit line BL. The read result by the read voltage BR is stored in, for example, the latch circuit XDL in each sense amplifier unit SAU.

If the read data of the lower page is determined, the sequencer 14 ends the read operation of the lower page and causes the semiconductor storage device 10 to change from the busy state to the ready state. Then, the read data stored in the latch circuit XDL in each sense amplifier unit SAU is output to the memory controller 30 based on an instruction from the memory controller 30.

Upper Page Read

The memory controller 30 transmits a command set CSET including address information ADD designating the upper page and the read command CMD to the semiconductor storage device 10. Then, the sequencer 14 causes the semiconductor storage device 10 to change from the ready state to the busy state and starts the read operation based on the received command set CSET.

If the read operation by which the upper page is selected starts, the read voltages AR and CR are sequentially applied to the select word line WLsel. Then, the sequencer 14 asserts the control signal STB while each of the read voltages AR and CR is applied to the select word line WLsel and determines data corresponding to the voltage of the bit line BL. The read results by the read voltages AR and CR are stored in, for example, the latch circuits ADL and BDL respectively in the respective sense amplifier units SAU.

Thereafter, the logic circuit LC performs a logic operation by using the data stored in the latch circuits ADL and BDL, and determines the read data of the upper page. The determined read data is stored in, for example, the latch circuit XDL of each sense amplifier unit SAU.

If the read data of the upper page is determined, the sequencer 14 ends the read operation of the upper page, and causes the semiconductor storage device 10 to change from the busy state to the ready state. Then, the read data stored in the latch circuit XDL in each sense amplifier unit SAU is output to the memory controller 30 based on an instruction from the memory controller 30.

In the patrol read (lower page read and upper page read) described above, the read voltage based on the correction value table is used. An exchange between the memory controller 30 and the semiconductor storage device 10 in the patrol read is the same as the read operation based on the command from the host apparatus 2 and can be changed as appropriate.

1-2-3 Correction Operation

In the correction operation, a correction value of an optimum read voltage is calculated according to the fail bit count generated between two adjacent states. First, definition of the fail bit used in the correction operation will be described with reference to FIG. 8.

FIG. 8 illustrates an example of a fail bit between two adjacent states in the memory system 1 according to the first embodiment. One of the two states illustrated in FIG. 8 corresponds to data of "1", and the other corresponds to data of "0". VCG is a read voltage set between the state of the data of "1" and the state of the data of "0".

It is preferable that two adjacent states are separated. However, an overlapping portion may be formed in two adjacent states as illustrated in (a) of FIG. 8. In (a) of FIG. 8, the overlapping portion between two adjacent states is added. The overlapping portion includes a fail bit in one of the two adjacent states.

In (b) and (c) of FIG. 8, the state corresponding to the data of "1" and "0" is denoted by a solid line, and the other state is denoted by a dashed line. Further, in (b) and (c) of FIG. 8, the overlapping portion between two adjacent states are illustrated independently.

As illustrated in (b) of FIG. 8, in the state corresponding to the data of "1", data of the memory cell transistor MT whose threshold voltage is higher than or equal to the read voltage VCG is a fail bit. The fail bit changed from the data of "1" to the data of "0" by the error correction process is detected and corrected to the data of "1".

As illustrated in (c) of FIG. 8, in the state corresponding to the data of "0", data of the memory cell transistor MT whose threshold voltage is lower than the read voltage VCG is a fail bit. The fail bit changed from the data of "0" to the data of "1" by the error correction process is detected and corrected to the data of "0".

A data definition of two adjacent states illustrated in FIG. 8 may be interchanged. In the following, the fail bit occurring at an upper tail of a lower threshold voltage state of two adjacent states is referred to as an upper tail fail bit TFB, and the fail bit occurring at a lower tail of a higher threshold voltage state is referred to as a lower tail fail bit BFB. The number of upper tail fail bits TFB is referred to as an upper tail fail bit count TFBC, and the number of lower tail fail bits BFB is referred to as a lower tail fail bit count BFBC.

When the memory cell transistor MT stores a plurality of bits of data, the CPU 31 can specify the type of fail bit detected by the error correction process by combining the data before error correction and the data after the error correction. When the MLC method is used, the upper tail fail bit TFB and the lower tail fail bit BFB between the two adjacent states are associated with each other, for example, as illustrated below.

Example

"Upper bit before correction/lower bit before correction-"→"upper bit after correction/lower bit after correction": type of corresponding fail bit "11"→"01": upper tail fail bit TFB of "Er" state
"01"→"11": lower tail fail bit BFB of "A" state
"01"→"00": upper tail fail bit TFB of "A" state
"00"→"01": lower tail fail bit BFB of "B" state
"00"→"10": upper tail fail bit TFB of "B" state
"10"→"00": lower tail fail bit BFB of "C" state.

Correction Method of Read Voltage

FIG. 9 illustrates an example of setting of a shift amount of the read voltage in the correction operation of the memory system 1 according to the first embodiment. A fail bit count FBC corresponds to the total fail bit counts between two adjacent states and corresponds to the sum of the lower tail fail bit count BFBC and the upper tail fail bit count TFBC. A fail ratio RAT corresponds to a ratio between the lower tail fail bit count BFBC and the upper tail fail bit count TFBC between two adjacent states and corresponds to, for example, a numerical value obtained by dividing BFBC by TFBC. The shift amount of the read voltage is described by the DAC value. In the present example, a value obtained by multiplying the DAC value by a predetermined voltage value corresponds to the shift amount of the read voltage.

As illustrated in FIG. 9, for example, when BFBC=10 and TFBC=100, the fail bit count FBC is 110 and the fail ratio RAT is 0.1. When BFBC=30 and TFBC=60, the fail bit count FBC is 90 and the fail ratio RAT is 0.5. When BFBC=40 and TFBC=40, the fail bit count FBC is 80 and the fail ratio RAT is 1. When BFBC=60 and TFBC=30, the fail bit count FBC is 90 and the fail ratio RAT is 2. When BFBC=100 and TFBC=10, the fail bit count FBC is 110 and the fail ratio RAT is 10.

As such, the fail bit count FBC tends to decrease, for example, as the fail ratio RAT approaches 1. Further, when the read voltage is shifted in a positive direction, it is considered that the lower tail fail bit count BFBC increases and the upper tail fail bit count TFBC decreases, and when the read voltage is shifted in a negative direction, it is considered that the lower tail fail bit count BFBC decreases and the upper tail fail bit count TFBC increases.

Accordingly, the shift amount of the read voltage is set in the positive direction when the fail ratio RAT is smaller than 1, and is set in the negative direction when the fail ratio RAT is larger than 1. Furthermore, the shift amount of the read voltage is set so as to increase as the fail ratio RAT goes away from 1. For example, when RAT=0.1, the read voltage is shifted by +5 DAC. When RAT=0.5, the read voltage is shifted by +3 DAC. When RAT=1, the read voltage is not shifted. When RAT=2, the read voltage is shifted by −3 DAC. When RAT=10, the read voltage is shifted by −5 DAC.

The shift amount of the read voltage for the fail ratio RAT is not limited to the setting illustrated in FIG. 9. In the memory system 1 according to the first embodiment, the shift amount of the read voltage in the correction operation may be determined based on at least the fail ratio RAT.

The read voltage correction described above is performed for each read voltage. For example, when the MLC method is used, the fail bit count FBC corresponding to the read voltage AR corresponds to the sum of TFBC of the "Er" state and BFBC of the "A" state. The fail bit count FBC corresponding to the read voltage BR corresponds to the sum of TFBC of the "A" state and BFBC of the "B" state. The fail bit count FBC corresponding to the read voltage CR corresponds to the sum of TFBC of the "B" state and BFBC of the "C" state.

Then, the fail ratio RAT corresponding to the "Er" and "A" states, the fail ratio RAT corresponding to the "A" and "B" states, and the fail ratio RAT corresponding to the "B" and "C" states are calculated and the shift amount of the read voltage is determined for each of the read voltages AR, BR, and CR. Thereafter, the correction value table is updated appropriately based on the determined shift amount of the read voltage.

FIG. 10 illustrates an example of the correction value table of the memory system 1 according to the first embodiment. A chip ID is a number assigned to each semiconductor storage device 10. A correction value COL corresponds to the correction value of each read voltage used in the read operation. For example, the correction value COL is managed by a digital analog converter (DAC) value for each read voltage.

As illustrated in FIG. 10, the correction value COL of the read voltage is managed for each combination of, for example, the chip ID, the block BLK, the string unit SU, and the word line WL. In other words, the correction value COL is managed on the word line WL basis. In the read operation, the correction value COL of the address corresponding to the select word line WLsel is referred to, and a voltage obtained by shifting the reference read voltage based on the correction value COL is used as the read voltage. Further, in the read operation on a page basis, for example, only the correction value of the read voltage to be used is referred to.

A configuration of the correction value table is not limited to the configuration described above. For example, the correction value COL may be appropriately grouped. The memory system 1 can reduce a size of the correction value table by applying the common correction value COL to the plurality of word lines WL having similar characteristics.

Flow of Correction Operation

Figure 11:
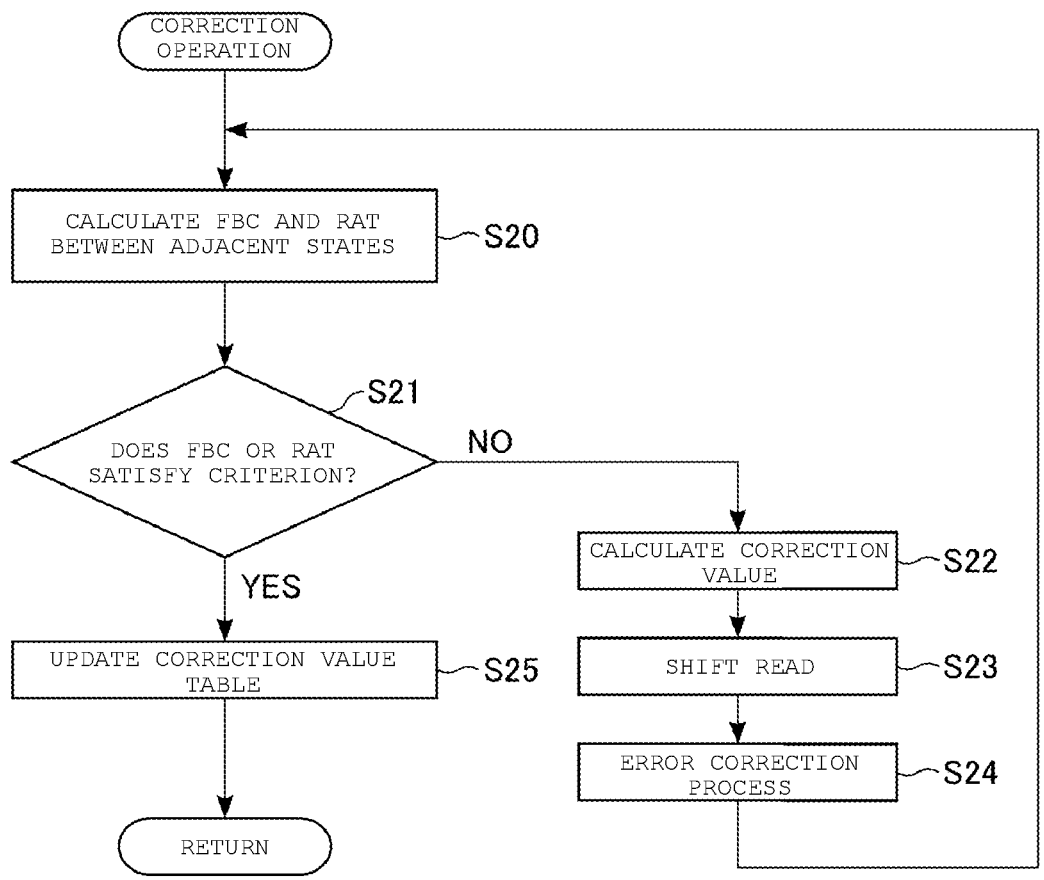
FIG. 11 is a flow chart illustrating an example of the correction operation of the memory system according to the first embodiment.

FIG. 11 illustrates an example of a flow of the correction operation of the memory system 1 according to the first embodiment. As illustrated in FIG. 11, if the correction operation starts, first, the CPU 31 calculates the fail bit count FBC and the fail ratio RAT between adjacent states based on the error correction process results in steps S12 and S13 (step S20).

Next, the CPU 31 checks whether or not the calculated fail bit count FBC or the fail ratio RAT satisfies a predetermined criterion (step S21). The predetermined criterion is set for each of the fail bit count FBC and the fail ratio RAT. For example, the criterion for the fail bit count FBC is that FBC is less than a predetermined value, and the criterion for the fail ratio RAT is that RAT is in a predetermined range including "1".

If FBC or RAT does not satisfy the criterion in step S21 (step S21, NO), the CPU 31 calculates a correction value of the read voltage based on the fail ratio RAT (step S22). The method described with reference to FIG. 9 is applied to the calculation of the correction value.

Then, the CPU 31 performs a shift read by using the calculated correction value of the read voltage (step S23). The shift read is a read operation in which the read voltage to be used is shifted for the patrol read in step S11.

Then, the CPU 31 causes the ECC circuit 34 to perform an error correction process for the read result of the shift read (step S24). The error correction process in step S24 corresponds to the hard determination decoding process as in step S12. In the error correction process in step S24, since the read result of the shift read for the page that is successful in error correction is used, the error correction succeeds with a high probability. If the hard determination decoding process in step S24 is completed, the CPU 31 returns to the process of step S20. That is, the processes in steps S20 to S24 are repeatedly performed as appropriate.

When FBC or RAT satisfies the criterion in step S21 (step S21, YES), the CPU 31 updates the correction value table based on, for example, the correction value of the read voltage used for the shift read and a result of the error correction process (step S25). When updating the correction value table is completed, the CPU 31 completes the correction operation. That is, the CPU 31 proceeds to the process of step S15 and updates a history table of the patrol operation.

The processes in steps S20 to S22 in the correction operation described above are performed for each of the set read voltages. That is, in step S21, a read voltage that satisfies the condition set forth in step S21 (i.e., whether or not FBC or RAT satisfy the criterion) and a read voltage that does not satisfy the condition set forth in step S21 may coexist. In this case, the CPU 31 preferentially selects a case where the condition set forth in step S21 is not satisfied, such that the processes of steps S20 to S24 are repeated a predetermined number of times, until a predetermined state passes the condition set forth in step S21 and the process transitions from step S21 to step S25.

When there is a page that satisfies the condition set forth in step S21 during the repetition of the processes of steps S20 to S24, the processes for the page in steps S22 to S24 may be omitted. In this case, in the calculation of FBC and RAT in step S20, a result based on the latest shift read for the page is used.

In the above description, a case where the shift read using the calculated correction value is performed after the correction value of the read voltage is calculated in step S22 is given as an example, but the present disclosure is not limited to this. For example, after step S22, the correction value table may be updated based on the calculated correction value. In this case, a read operation based on the correction value table is performed in step S23. Although a case where the CPU 31 calculates FBC and RAT is given as an example, FBC and RAT may be calculated by the ECC circuit 24.

Specific Example of Correction Operation

Next, a specific example of the correction operation will be described by focusing on an upper page. In the following description, the fail bit count FBC of the read voltage AR indicates FBC corresponding to a set of "Er" and "A" states, and the fail ratio RAT of the read voltage AR indicates RAT corresponding to a set of the "Er" and "A" states. Likewise, the fail bit count FBC of the read voltage CR indicates FBC corresponding to a set of the "B" and "C" states, and the fail ratio RAT of the read voltage CR indicates RAT corresponding to a set of the "B" and "C" states.

FIG. 12 illustrates an example of a change in the correction value COL, the fail bit count FBC, and the fail ratio RAT in the correction operation of the memory system 1 according to the first embodiment. As illustrated in FIG. 12, the correction value COL of the read voltages AR and CR before the correction operation is set to "0". FBC<30 or 0.7<RAT<1.5 is set as an example of criteria for FBC and RAT in step S21.

As illustrated in (a) of FIG. 12, in a first read operation, the read voltage AR to which the correction value COL=0 is applied and the read voltage CR to which the correction value COL=0 is applied are used. In a first read result, the FBCs of the read voltages AR and CR are 60 and 80, respectively, and the RATs of the read voltages AR and CR are 0.5 and 2, respectively. That is, the read voltages AR and CR do not satisfy the criteria for FBC and RAT, respectively.

In this case, correction values are calculated for each of the read voltages AR and CR. For example, the CPU 31 applies +2 DAC correction for the read voltage AR based on RAT=0.5 and applies −5 DAC correction for the read voltage CR based on RAT=2. Then, the CPU 31 performs a second read operation to which the correction value of the obtained read voltage is applied.

As illustrated in (b) of FIG. 12, in the second read operation, the read voltage AR to which the correction value COL=+2 DAC is applied and the read voltage CR to which the correction value COL=−5 DAC is applied are used. In a second read result, the FBCs of the read voltages AR and CR are 25 and 50, respectively, and the RATs of the read voltages AR and CR are 0.8 and 0.5, respectively. That is, the read voltage AR satisfies the criteria for FBC and RAT ("A" pass). Meanwhile, the read voltage CR does not satisfy the criteria for FBC and RAT.

In this case, a correction value is calculated for the read voltage CR. For example, the CPU 31 applies correction of +3 DAC to the read voltage CR based on RAT=0.5. Further, the CPU 31 performs fine adjustment for the read voltage AR satisfying the standard and applies correction of +1 DAC on the read voltage AR based on RAT=0.8. Then, the CPU 31 performs the second read operation to which the correction value of the obtained read voltage is applied.

As illustrated in (c) of FIG. 12, in a third read operation, the read voltage AR to which the correction value COL=+3 DAC is applied and the read voltage CR to which the correction value COL=−2 DAC is applied are used. In a third read result, FBCs of the read voltages AR and CR are 20 and 40, respectively, and the RATs of the read voltages AR and CR are 1 and 1.2, respectively. That is, the read voltage AR satisfies the criteria for FBC and RAT as in the second read result. Meanwhile, the read voltage CR does not satisfy the criterion for FBC and satisfies the criterion for RAT.

As such, even when only one of the criteria for FBC and RAT is satisfied, the check in step S21 for the read voltage CR is satisfied ("C" pass). The CPU 31 performs a fine adjustment for the read voltage CR, applies correction of −1 DAC for the read voltage CR based on RAT=1.2, and completes the correction operation.

As a result, as illustrated in (d) of FIG. 12, the correction values COL of the read voltages AR and CR after the correction operation are set to "+3" and "−3", respectively. Since the correction of ±1 DAC for the read voltage that satisfies the check in step S21 is a fine adjustment for making the read voltage with fewer errors, the correction amount may be changed or the correction may be omitted.

Figure 13:
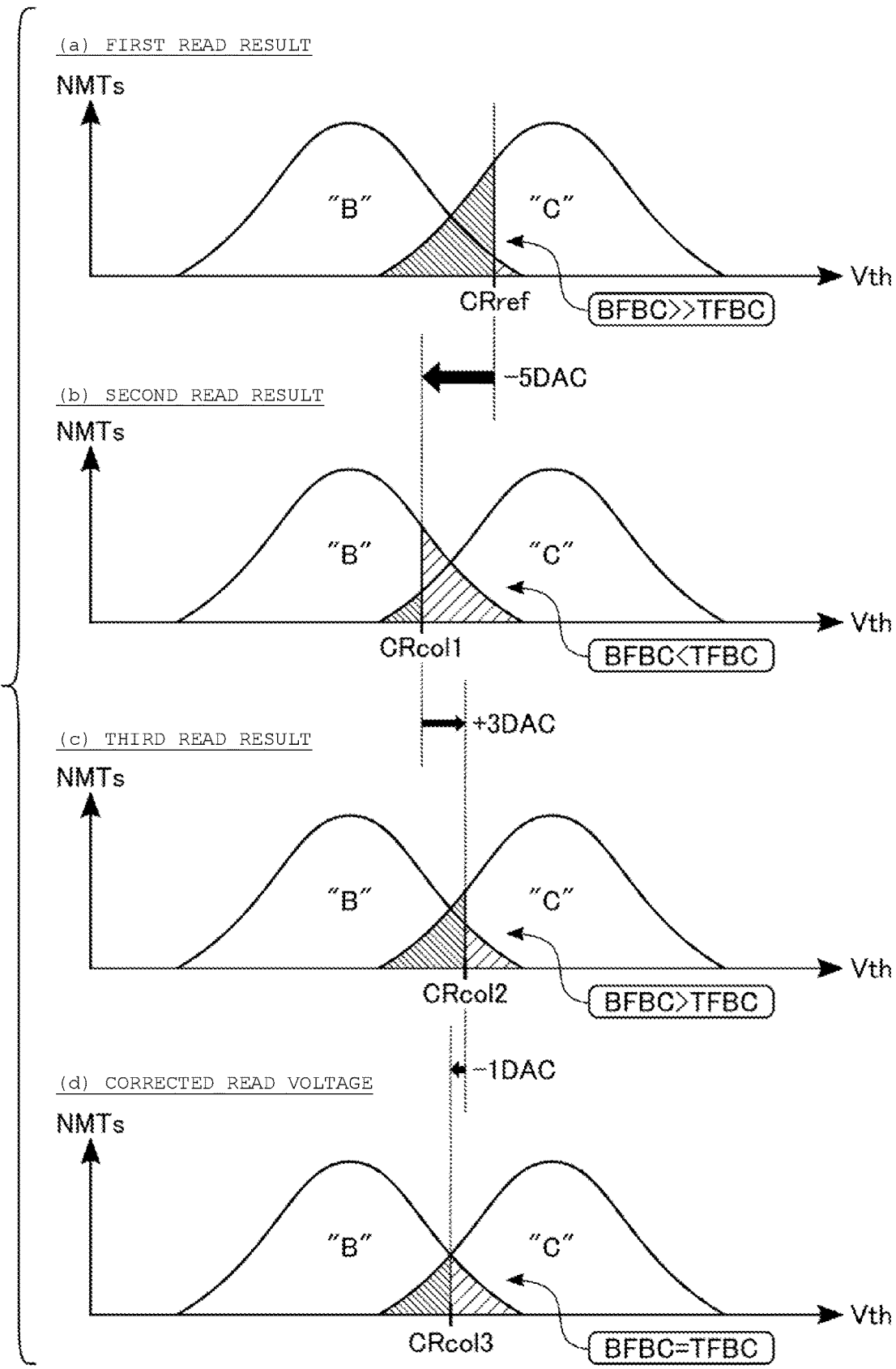
FIG. 13 is a threshold voltage distribution diagram illustrating an example of a change in fail bit count in the correction operation of the memory system according to the first embodiment.

FIG. 13 is an example of a change in the fail bit count FBC in the correction operation of the memory system according to the first embodiment, and illustrates a threshold voltage distribution relating to the read voltage CR in FIG. 12. CRref, CRcol1, CRcol2, and CRcol3 are read voltages CR to which the correction values COL=0 DAC, −5 DAC, −2 DAC, and −3 DAC are applied, respectively.

As illustrated in (a) of FIG. 13, in the first read result in which CRref is used, BFBC>>TFBC. Accordingly, in the subsequent second read operation, the read voltage CR is largely corrected in the negative direction in which the number of lower tail fail bits BFBC is reduced.

As illustrated in (b) of FIG. 13, in the second read result in which CRcol1 is used, BFBC<TFBC. Accordingly, in the subsequent third read operation, the read voltage CR is corrected in the positive direction in which the upper tail fail bit count TFBC is reduced.

As illustrated in (c) of FIG. 13, in the third read result in which CRcol2 is used, BFBC>FBC. Meanwhile, as described with reference to FIG. 12, the condition of RAT in step S21 is satisfied in the third read result. Accordingly, the corrected read voltage is finely adjusted in the negative direction in which the lower tail fail bit count BFBC is reduced.

In the read operation using the corrected read voltage CRcol3, approaching to BFBC=TFBC is expected as illustrated in (d) of FIG. 13. In other words, in the read operation using the corrected read voltage CRcol3, it is expected that the fail ratio RAT approaches "1" and the fail bit count FBC is minimized.

1-3 Effect of First Embodiment

According to the memory system 1 of the first embodiment described above, it is possible to account for stress states of the memory cell transistors MT connected to the common word line WL when correcting read voltages during a read operation. Hereinafter, detailed effects of the memory system 1 according to the first embodiment will be described.

The memory cell transistor MT has a threshold voltage that changes depending on the number of electrons in a charge storage layer and stores different data based on the threshold voltage. However, the electrons in the charge storage layer may increase or decrease due to stress caused by various operations or time elapse. That is, the threshold voltage of the memory cell transistor MT may change after the write operation.

For example, an unintended increase in threshold voltage caused by a read operation is referred to as a read disturb. An unintended increase in threshold voltage caused by a write operation is referred to as a program disturb. A decrease in threshold voltage over time is referred to as a data retention deterioration. If the number of times of write and erasure increases and the memory cell transistor MT is worn, the threshold voltage distribution shortly after the write operation tends to be widened.

If a shape of the threshold voltage distribution changes due to such various influences, the fail bit count FBC increases, and error correction of read data may not be made. It is considered that one method of reducing the fail bit count FBC is to correct the read voltage by periodically performing the patrol operation. Thereby, a correction value of the read voltage is maintained in an optimum state, and a risk that the data cannot be error-corrected is further reduced.

Furthermore, in the memory system 1 according to the first embodiment, the fail ratio RAT, which is a ratio between the lower tail fail bit count BFBC and the upper tail fail bit count TFBC, is used in the correction operation. The fail ratio RAT indicates a bias between a fail bit generated in a lower threshold voltage state and a fail bit generated in a higher threshold voltage state in two adjacent states.

Accordingly, the memory system 1 can estimate a direction and a magnitude for correcting the read voltage by using the fail ratio RAT. The memory system 1 can correct the read voltage with a high accuracy by repeating a combination of calculation of the correction value and the shift read in the correction operation and bringing the fail ratio RAT close to 1. As a result, the memory system 1 according to the first embodiment can prevent a read error and increase reliability of stored data.

A shape of the threshold voltage distribution of the memory cell transistor MT or a state of overlap between two adjacent states can be estimated from the information of the fail bit count FBC and the fail ratio RAT obtained by the correction operation. That is, the correction operation in the first embodiment can estimate not only a symmetrical threshold voltage distribution but also a shape of the asymmetric threshold voltage distribution, and can estimate a stress state of the memory cell transistor MT. In the present specification, the "symmetric threshold voltage distribution" indicates a threshold voltage distribution in which the upper tail and the lower tail are similar in shape, and the "asymmetric threshold voltage distribution" indicates a threshold voltage distribution in which the upper tail and the lower tail are different in shape.

For example, when the fail bit count FBC is large, it is estimated that the overlap between two adjacent states is large. When a numerical value of the correction value COL of the read voltage is in the positive direction, it is estimated that an intersection of two adjacent states is shifted in the positive direction. When the numerical value of the correction value COL of the read voltage is in the negative direction, it is estimated that the intersection of the two adjacent states is shifted in the positive direction.

Hereinafter, an example of an association between information obtained by the correction operation and a stress state will be described with reference to FIGS. 14 to 19. In the following description, "large" indicates a large numerical value, "small" indicates a small numerical value, and "medium" indicates a numerical value between the "large" and the "small". "0" indicates a value of 0 or a value near 0.

FIG. 14 is an example of stress states of the memory system 1 according to the first embodiment, and illustrates a relationship between the fail bit count FBC and the correction value COL corresponding to each read voltage and the stress state. As illustrated in FIG. 14, the stress states of the memory cell transistor MT include, for example, five types of states (first state to fifth state).

An example of a threshold voltage distribution of the memory cell transistor MT in the first state is illustrated in FIG. 15. In the first state, the fail bit count FBC corresponding to each read voltage is "small", and the correction value COL for each read voltage is "0". The threshold voltage distribution in the first state is formed shortly after write and formed when the memory cell transistor MT is not subject to much wear, and corresponds to a state shortly after the write.

Figure 16:
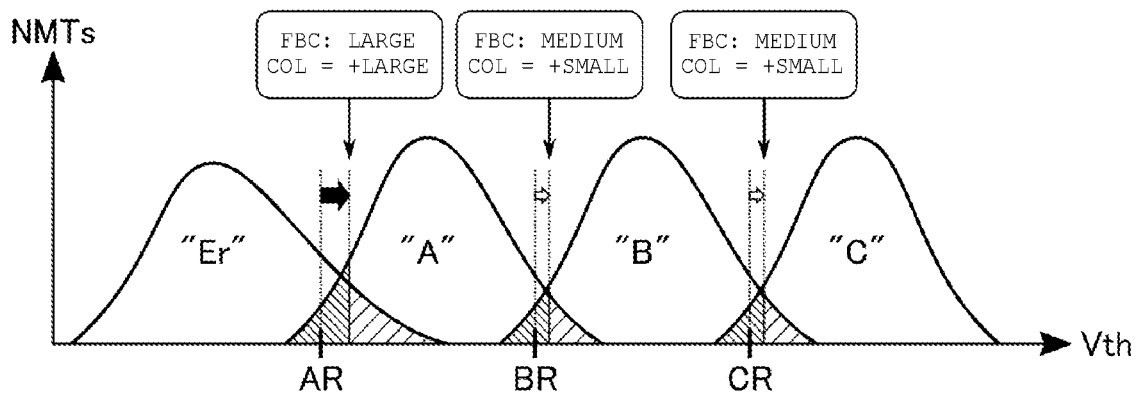
FIG. 16 is a threshold voltage distribution diagram illustrating an example of a threshold voltage distribution of a second state in the memory system according to the first embodiment.

An example of the threshold voltage distribution of the memory cell transistor MT in a second state is illustrated in FIG. 16. In the second state, the fail bit count FBC corresponding to the read voltage AR is "large", and the correction value COL for the read voltage AR is "large" in the positive direction. In the second state, for example, the fail bit count FBC corresponding to the read voltages BR and CR is "medium", and the correction value COL for the read voltages BR and CR is "small" in the positive direction. The threshold voltage distribution in the second state is estimated to be formed when an influence of the read disturb is large.

Figure 17:
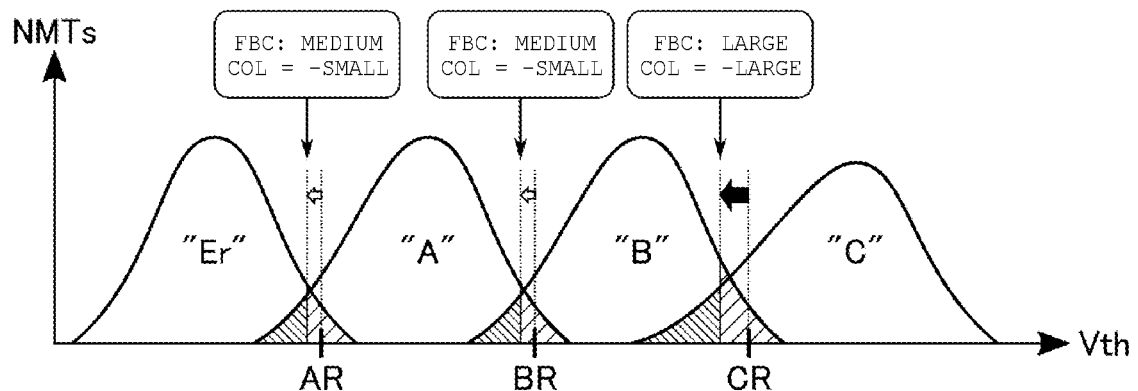
FIG. 17 is a threshold voltage distribution diagram illustrating an example of a threshold voltage distribution of a third state in the memory system according to the first embodiment.

An example of the threshold voltage distribution of the memory cell transistor MT in a third state is illustrated in FIG. 17. In the third state, the fail bit count FBC corresponding to the read voltage CR is "large", and the correction value COL for the read voltage CR is "large" in the negative direction. In the third state, for example, the fail bit count FBC corresponding to the read voltages AR and BR is "medium", and the correction value COL for the read voltages AR and BR is "small" in the negative direction. The threshold voltage distribution in the third state is estimated to be formed when an influence of the data retention deterioration is large.

Figure 18:
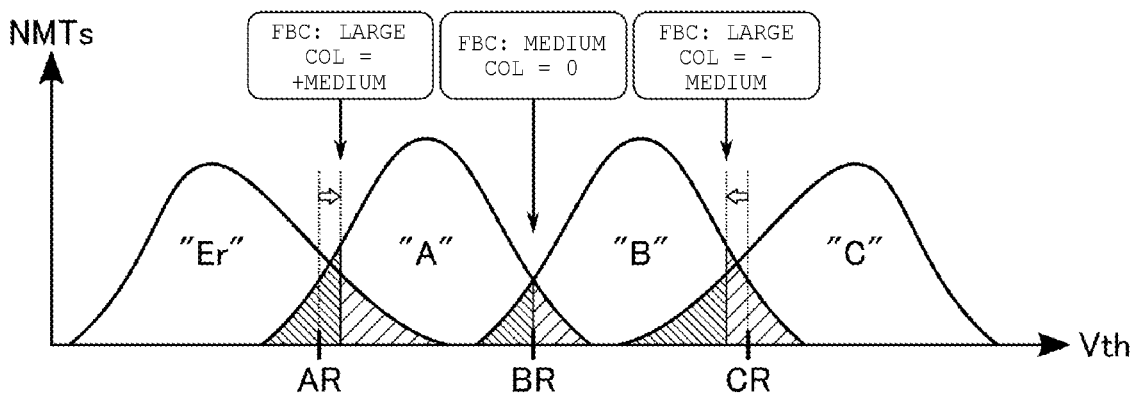
FIG. 18 is a threshold voltage distribution diagram illustrating an example of a threshold voltage distribution of a fourth state in the memory system according to the first embodiment.

An example of the threshold voltage distribution of the memory cell transistor MT in a fourth state is illustrated in FIG. 18. In the fourth state, the fail bit count FBC corresponding to the read voltages AR and CR is "large", and the correction value COL for the read voltages AR and CR is "large" in the positive and negative directions, respectively. In the fourth state, for example, the fail bit count FBC corresponding to the read voltage BR is "medium", and the correction value COL for the read voltage BR is "0". The threshold voltage distribution in the fourth state is estimated to be formed when both the read disturb and the data retention deterioration (RD & DR) have a large influence.

Figure 19:
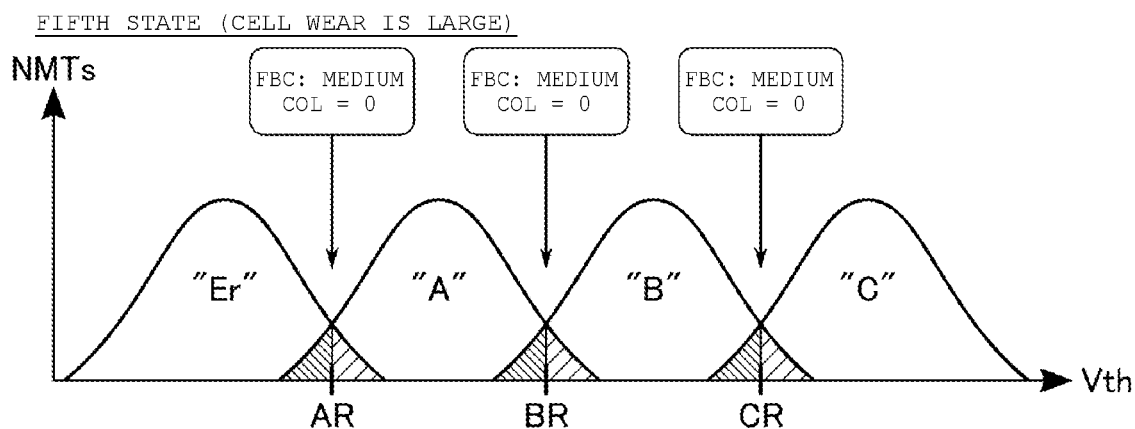
FIG. 19 is a threshold voltage distribution diagram illustrating an example of a threshold voltage distribution of a fifth state in the memory system according to the first embodiment.

An example of the threshold voltage distribution of the memory cell transistor MT in a fifth state is illustrated in FIG. 19. In the fifth state, the fail bit count FBC corresponding to each read voltage is "medium", and the correction value COL for each read voltage is "0". The threshold voltage distribution in the fifth state is estimated to be formed shortly after write and formed when the memory cell transistor MT is worn (when the cell wear is large).

The five types of stress states described above are merely examples, and the stress states may be set in consideration of all possibilities. In order to estimate the stress state, the fail ratio RAT may be used in addition to the fail bit count FBC and the correction value COL. For specifying the stress state, for example, a range of the fail bit count FBC and the correction value COL is set for each stress state, and one stress state is selected according to the values of FBC and COL obtained by the correction operation.

2. Second Embodiment

A second embodiment is a specific example of a method of using stress information obtained by the first embodiment. The memory system 1 according to the second embodiment performs a soft determination decoding process based on information of the stress state (hereinafter, referred to as stress information) and corrects an error. Hereinafter, the memory system 1 according to the second embodiment will be described while referring to a difference from the first embodiment.

2-1 Configuration of Memory Controller 30

Figure 20:
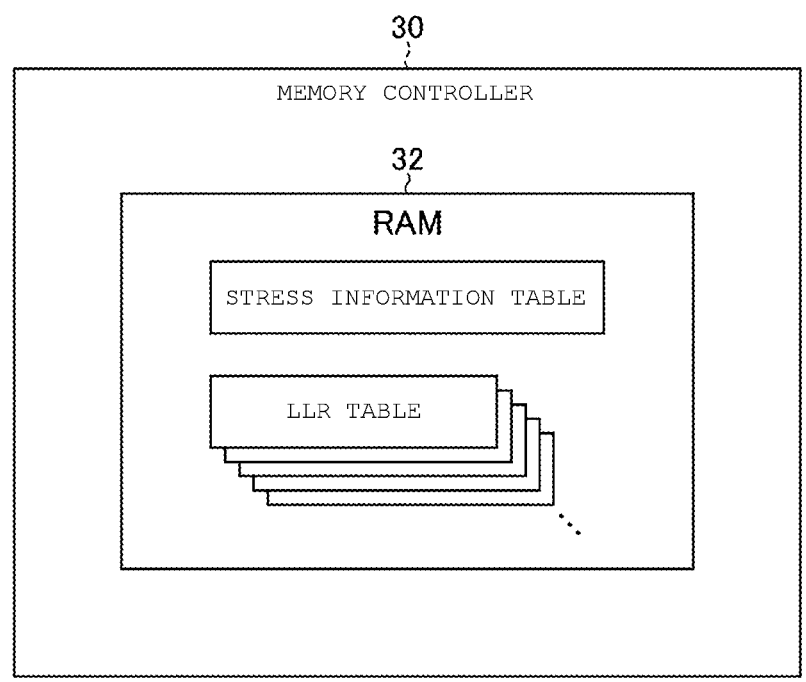
FIG. 20 is a block diagram illustrating a configuration example of a memory controller in a memory system according to a second embodiment.

FIG. 20 illustrates a configuration example of the memory controller 30 in the memory system 1 according to the second embodiment. As illustrated in FIG. 20, in the second embodiment, the RAM 32 in the memory controller 30 stores a stress information table and a plurality of log likelihood ratio (LLR) table.

The stress information table stores the stress information described in the first embodiment and is updated, for example, after the correction value table is updated. An example of the stress information table is illustrated in FIG. 21. For example, the stress information is recorded for each word line WL, and "1" to "5" of the stress information corresponds to the first state to the fifth state, respectively. A unit in which the stress information is managed is not limited to a unit of the word line WL, and grouping may be performed as appropriate.

The log likelihood ratio table (hereinafter, referred to as an LLR table) is referred to by the ECC circuit 24 in the soft determination decoding process. The LLR table stores a relationship between each divided range and a log likelihood ratio (LLR) value when the threshold voltage range that the memory cell transistor MT may have is divided into a plurality of ranges. The LLR value indicates a reliability (probability) of data read by a certain read voltage and is determined by a prior evaluation.

Hereinafter, a specific example of the LLR table used in the soft determination decoding process will be described with reference to FIGS. 22 to 24. Data allocation and LLR values in each LLR table illustrated below are merely examples. The LLR value may be a value previously set by pre-evaluation using the read voltage of a set soft bit.

Figure 22:
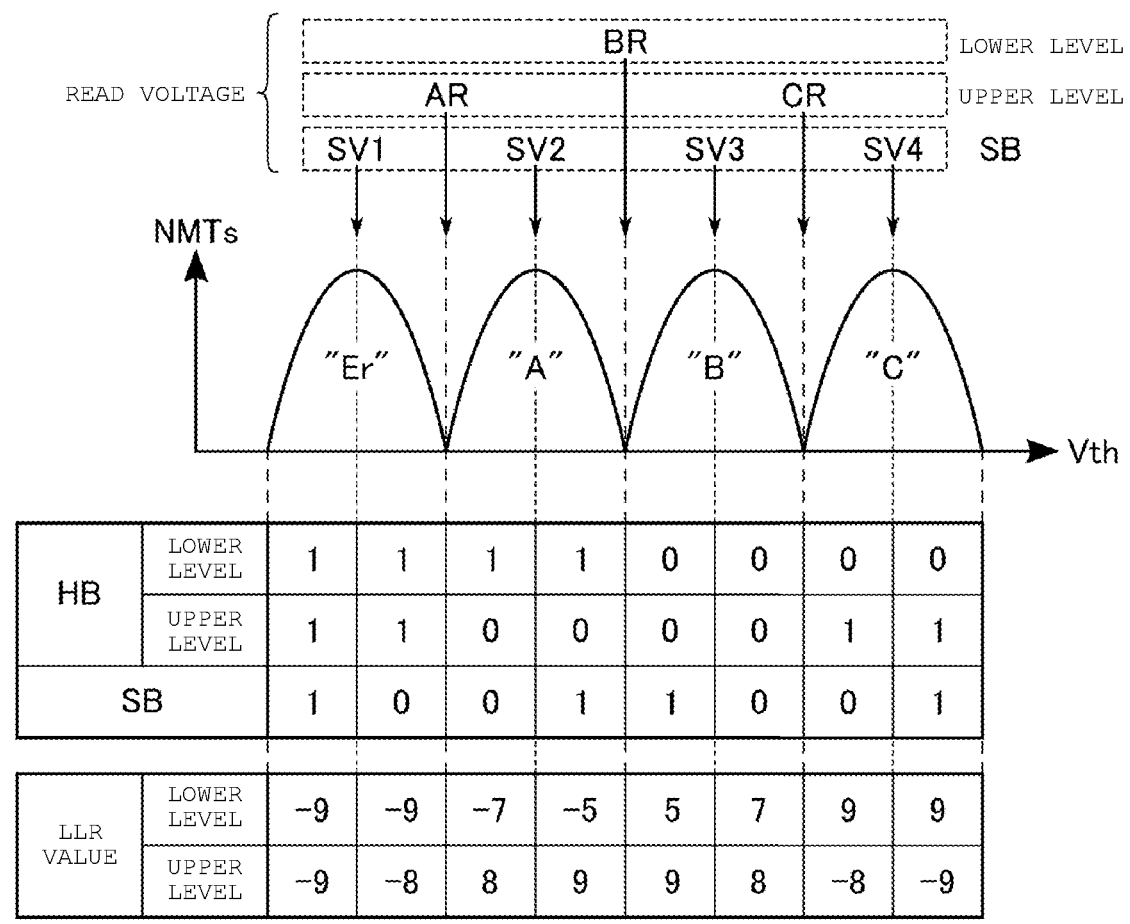
FIG. 22 is a threshold voltage distribution diagram illustrating an example of setting of an LLR table in the memory system according to the second embodiment.

FIG. 22 illustrates an example of the LLR table used when the soft bit is 1 bit. In the example illustrated in FIG. 22, read voltages of the soft bits SV1, SV2, SV3, and SV4 are set so that each state is divided into two. The read voltages SV1, SV2, SV3, and SV4 are voltages set to divide the "Er" state, "A" state, "B" state, and "C" state into two, respectively.

When such an LLR table is used, soft bit data SB is determined by a read operation using the read voltages SV1, SV2, SV3, and SV4. In the present example, the lower and higher LLR values are determined based on the lower and upper hard bit data HB and the lower and upper soft bit data SB. An example of the data allocation and the LLR values in the present LLR table is listed below.

Example

"Lower bit/upper bit/soft bit" data: "LLR value of lower bit, LLR value of upper bit"
"111" data: "−9, −9"
"110" data: "−9, −8"
"100" data: "−7, 8"
"101" data: "−5, 9"
"001" data: "5, 9"
"000" data: "7, 8"
"010" data: "9, −8"
"011" data: "9, −9".

As such, in the present LLR table, eight types of combinations of the lower and upper hard bit data HB and lower and upper soft bit data SB are formed. An LLR value of the lower bit and an LLR value of the upper bit are assigned to each of the eight types of combinations formed. The ECC circuit 24 can perform a soft determination decoding process of lower and upper page data by using the present LLR table.

Figure 23:
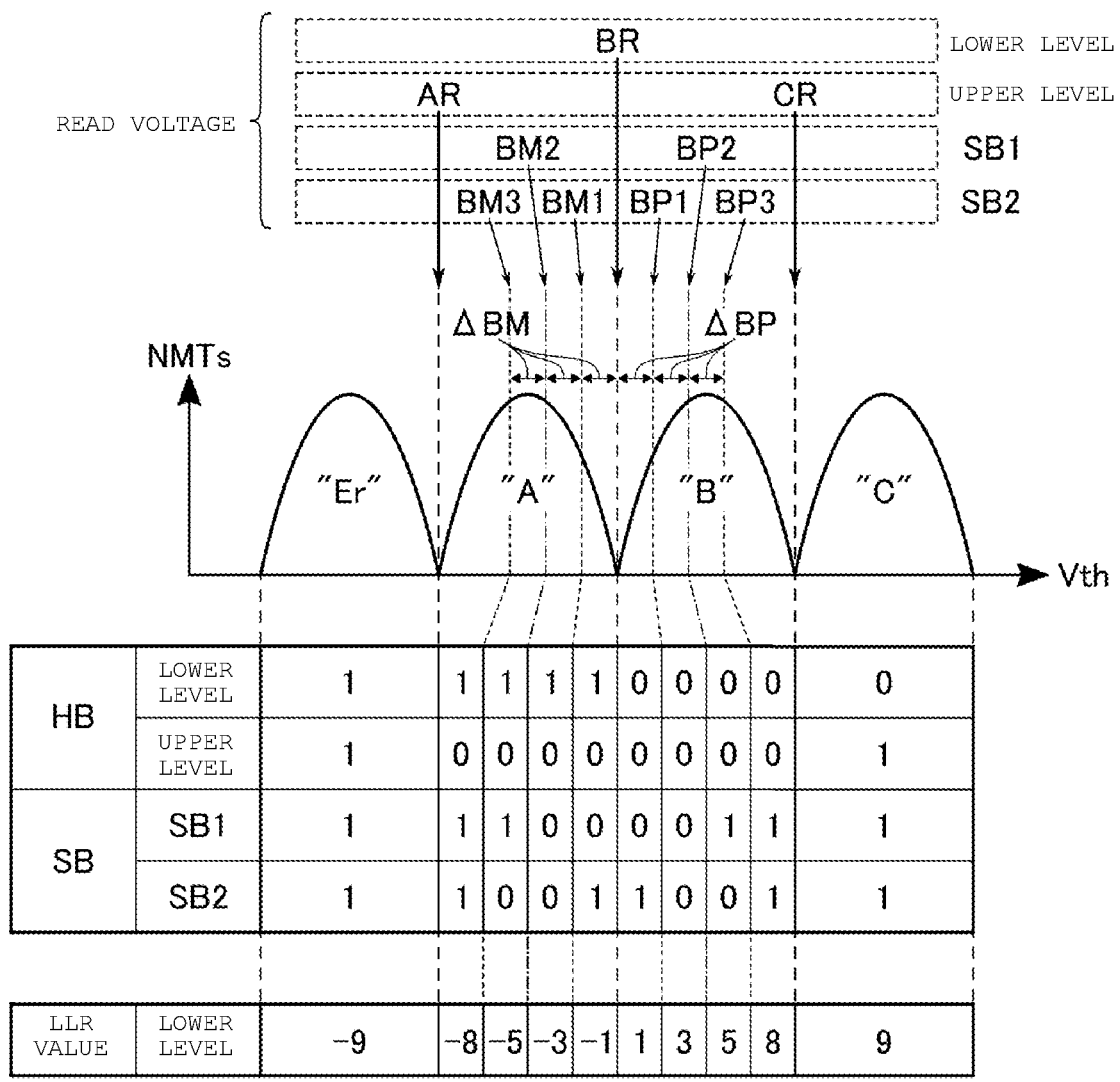
FIG. 23 is a threshold voltage distribution diagram illustrating one example of setting of the LLR table in the memory system according to the second embodiment.

FIG. 23 illustrates an example of the LLR table corresponding to the lower page with 2 soft bits. In the example illustrated in FIG. 23, read voltages of soft bit BM3, BM2, BM1, BP1, BP2, and BP3 are set near the read voltage BR. The read voltages BM1, BM2, and BM3 are voltages sequentially shifted by ΔBM in the negative direction with respect to the read voltage BR. The read voltages BP1, BP2, and BP3 are voltages sequentially shifted by ΔBP in the positive direction with respect to the read voltage BR.

When such an LLR table is used, the soft bit data SB1 is determined by a read operation using the read voltages of soft bit BM2 and BP2, and the soft bit data SB2 is determined by a read operation using the read voltages of soft bit BM3, BM1, BP1, and BP3. In the present example, the lower LLR value is determined based on the lower and upper hard bit data HB and each of the lower and upper soft bit data SB1 and SB2. An example of data allocation and LLR values in the present LLR table is listed below.

Example

"Lower bit/upper bit/SB1/SB2" data: LLR value of lower bit
"1111" data: −9
"1011" data: −8
"1010" data: −5
"1000" data: −3
"1001" data: −1
"0001" data: 1
"0000" data: 3
"0010" data: 5
"0011" data: 8
"0111" data: 9.

As such, in the present LLR table, 10 types of combinations of lower and upper hard bit data HB and lower and upper soft bit data SB1 and SB2 are formed. The LLR values of lower bits are assigned to each of the 10 types of combinations formed. The ECC circuit 24 can perform the soft determination decoding process of the lower page data by using the present LLR table.

Figure 24:
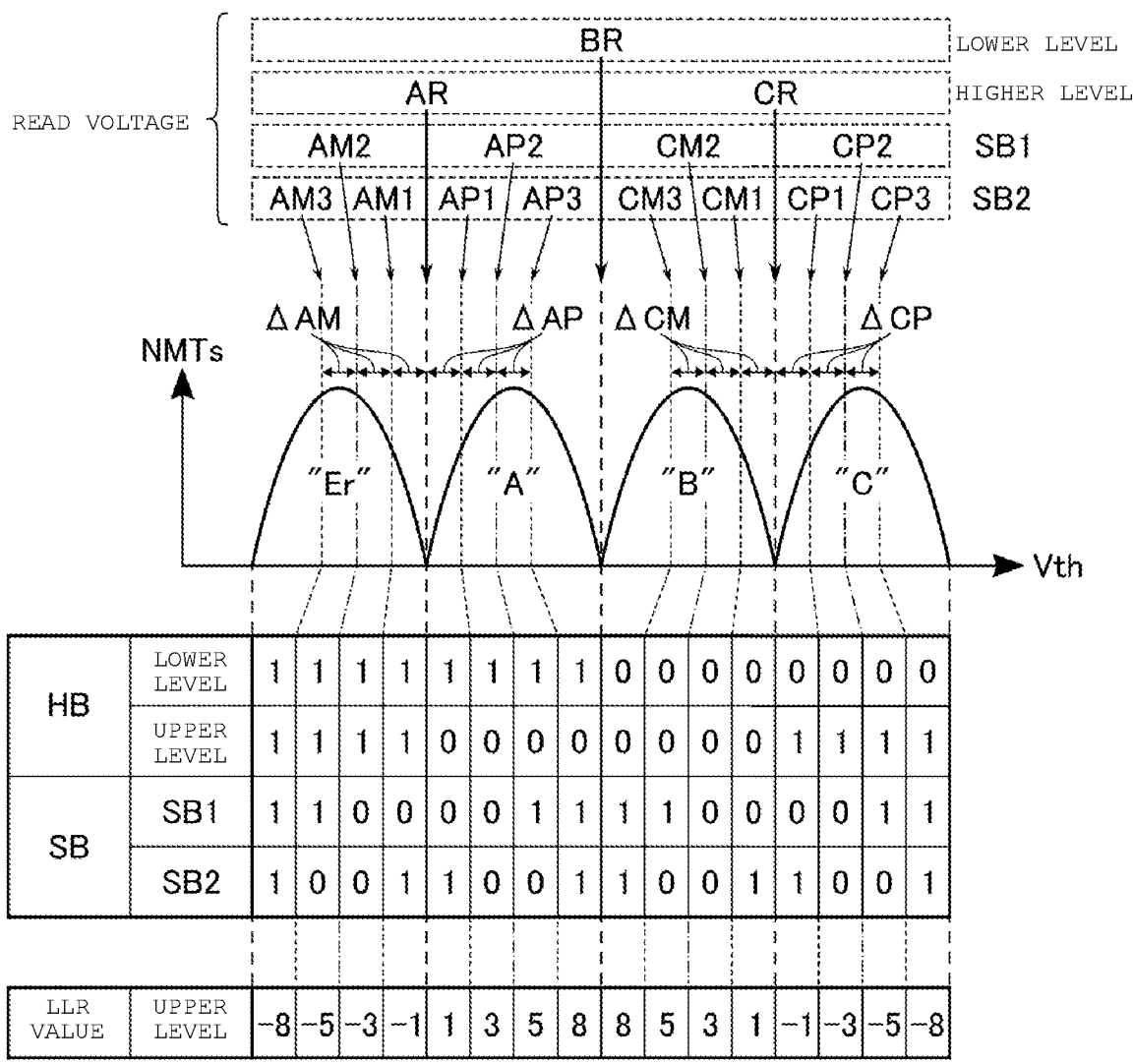
FIG. 24 is a threshold voltage distribution diagram illustrating another example of setting of the LLR table in the memory system according to the second embodiment.

FIG. 24 illustrates an example of an LLR table corresponding to the upper page with 2 soft bits. In the example illustrated in FIG. 24, read voltages of soft bit AM3, AM2, AM1, AP1, AP2, and AP3 are set near the read voltage AR, and read voltages of soft bit CM3, CM2, CM1, CP1, CP2, and CP3 are set near the read voltage CR. The read voltages AM1, AM2, and AM3 are voltages sequentially shifted by $\Delta$AM in the negative direction with respect to the read voltage AR. The read voltages AP1, AP2, and AP3 are voltages sequentially shifted by $\Delta$AP in the positive direction with respect to the read voltage AR. The read voltages CM1, CM2, and CM3 are voltages sequentially shifted by $\Delta$CM in the negative direction with respect to the read voltage CR. The read voltages CP1, CP2, and CP3 are voltages sequentially shifted by $\Delta$CP in the positive direction with respect to the read voltage CR.

When such an LLR table is used, the soft bit data SB1 is determined by a read operation using the read voltages AM2, AP2, CM2, and CP2, and the soft bit data SB2 is determined by a read operation using the read voltages AM3, AM1, AP1, AP3, CM3, CM1, CP1, and CP3. In the present example, the higher LLR value is determined based on the lower and upper hard bit data HB and the lower and upper soft bit data SB1 and SB2. The lower LLR value is determined. An example of data allocation and LLR values in the present LLR table is listed below.

Example

"Lower bit/upper bit/SB1/SB2" data: LLR value of upper bit
 "1111" data: −9
 "1110" data: −5
 "1100" data: −3
 "1101" data: −1
 "1001" data: 1
 "1000" data: 3
 "1010" data: 5
 "1011" data: 8
 "0011" data: 8
 "0010" data: 5
 "0000" data: 3
 "0001" data: 1
 "0101" data: −1
 "0100" data: −3
 "0110" data: −5
 "0111" data: −8.

As such, in the present LLR table, 16 types of combinations of the lower and upper hard bit data HB and the lower and upper soft bit data SB1 and SB2 are formed. The LLR value of upper bit is assigned to each of the 16 types of combinations formed. The ECC circuit 24 can perform the soft determination decoding process of upper page data by using the present LLR table.

In the memory system 1 according to the second embodiment, a plurality of types of the LLR tables are prepared according to setting of the soft bit to be used. For example, the RAM 32 stores a plurality of types of LLR tables which correspond to the lower page and in which read voltages of soft bit are set differently and stores a plurality of LLR tables which correspond to the upper page and in which read voltages of soft bit are set differently.

2-2 Soft Determination Decoding Process Using Stress Information

When the soft determination decoding process is performed, the read operation of a soft bit and the read operation of a hard bit are performed. Thereby, a range in which the threshold voltages of the respective memory cell transistors MT are is determined, and the LLR values for each memory cell transistor MT are determined based on the LLR table. In the soft determination decoding process, the ECC circuit 24 performs an iterative calculation based on a probability using the LLR value and performs detection and correction of an error.

Figure 25:
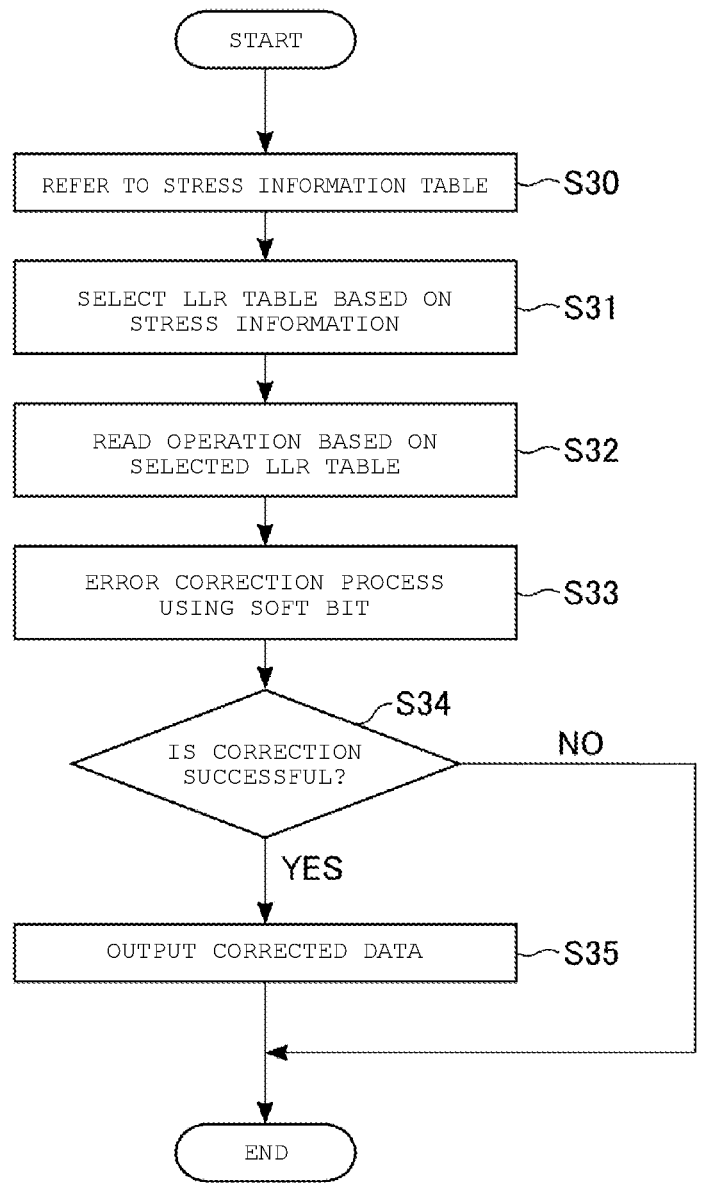
FIG. 25 is a flowchart illustrating an example of a retry sequence of the memory system according to the second embodiment.

FIG. 25 illustrates an example of a retry sequence performed when an error correction fails in the read operation based on a command from the host apparatus 2. As illustrated in FIG. 25, first, the CPU 31 checks stress information of the word line WL corresponding to a page for which the error correction fails with reference to a stress information table (step S30).

Next, the CPU 31 selects an LLR table based on the checked stress information (step S31). Then, the CPU 31 performs a read operation based on the selected LLR table (step S32). Specifically, in step S32, the CPU 31 causes the semiconductor storage device 10 to perform the read operation of a hard bit and a soft bit based on the selected LLR table.

Next, the CPU 31 causes the ECC circuit 34 to perform an error correction process for the received read result (step S33). The error correction process in step S33 corresponds to the soft determination decoding process using the soft bit. If the error correction process by the ECC circuit 34 is completed, the CPU 31 checks whether or not the error correction is successful (step S34).

If the error correction is successful in step S34 (step S34, YES), the CPU 31 outputs the corrected data to the host apparatus 2 via the host interface circuit 33 (step S35).

If the error correction fails in step S34 (step S34, NO), the memory controller 30 notifies the host apparatus 2 of, for example, failure in reading the page via the host interface circuit 33.

The retry sequence using the stress information described above may be performed during the patrol operation described in the first embodiment. Specifically, in the process of step S16 (retry sequence) of the flowchart illustrated in FIG. 6, for example, the processes of steps S30 to S33 may be sequentially performed. In this case, in step S31, the LLR table based on the stress information acquired in the previous patrol operation is selected.

Setting of Soft Bit Read Voltage

Figures 26, 27:
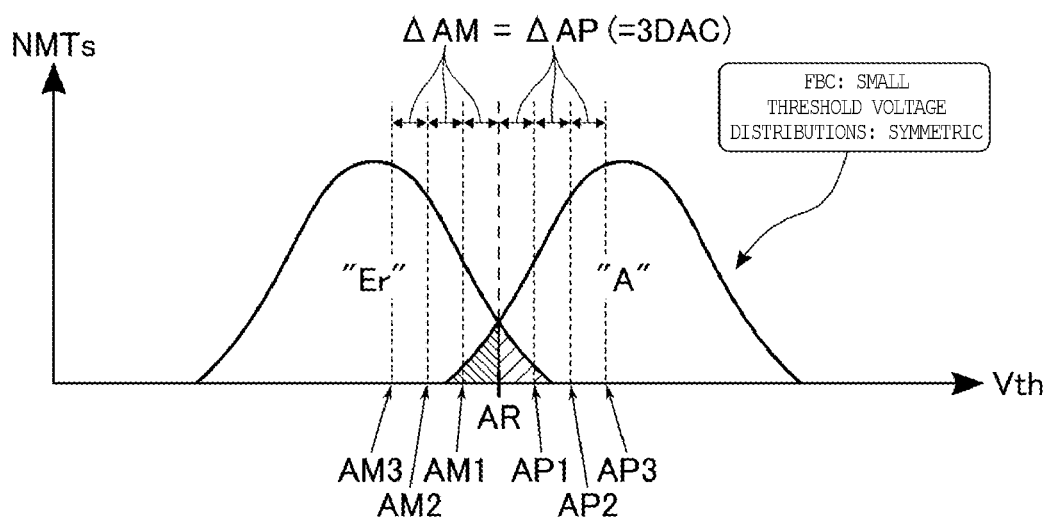
FIG. 26 is a table illustrating an example of a relationship between the stress state and the shift amount of the read voltage and the LLR table in the memory system according to the second embodiment.
FIG. 27 is a threshold voltage distribution diagram illustrating an example of setting of a soft bit read voltage based on the LLR table in the memory system according to the second embodiment.

FIG. 26 illustrates an example of a relationship between the stress state, the shift amount of the read voltage, and the LLR table in the memory system according to the second embodiment. Hereinafter, the shift amounts of the read voltages AR, BR, and CR in the negative direction are respectively referred to as $\Delta$AM, $\Delta$BM, and $\Delta$CM, and the shift amounts of the read voltages AR, BR, and CR in the positive direction are respectively referred to as $\Delta$AP, $\Delta$BP, and $\Delta$CP. Each of $\Delta$AM, $\Delta$AP, $\Delta$BM, $\Delta$BP, $\Delta$CM, and $\Delta$CP is managed by, for example, a DAC value.

As illustrated in FIG. 26, the memory system 1 according to the second embodiment includes, for example, five types of LLR tables 0 to 4. For example, the LLR table 0 is associated with a default state, that is, a first state corresponding to shortly after write. The LLR table 1 is associated with a second state where an influence of the read disturb is large. The LLR table 2 is associated with a third state where an influence of the data retention deterioration is large. The LLR table 3 is associated with a fourth state where an influence of the read disturb and data retention deterioration are large. The LLR table 4 is associated with a fifth state where a cell wear is large.

In the memory system 1 according to the second embodiment, setting of different shift amounts $\Delta$AM, $\Delta$AP, $\Delta$BM, $\Delta$BP, $\Delta$CM, and $\Delta$CP can be applied to each LLR table. A specific example of a method of setting the soft bit read voltage according to a threshold voltage distribution state will be described for each LLR table with reference to FIG. 26 as appropriate.

Each of ΔAM, ΔAP, ΔBM, ΔBP, ΔCM, and ΔCP corresponding to the LLR table 0 is set to "3". That is, in the LLR table 0, the shift amounts in the positive direction and the negative direction for each read voltage are equal. An example of the soft bit read voltage corresponding to the LLR table 0 and corresponding to the read voltage AR and a threshold voltage distribution is illustrated in FIG. 27.

As illustrated in FIG. 27, in the first state associated with the LLR table 0, threshold voltage distributions of the "Er" and "A" states are formed symmetrically, and the fail bit count FBC between the "Er" and "A" states is small. Then, it is presumed that shapes of the distributions of each of the upper tail fail bit TFB in the "Er" state and the lower tail fail bit BFB in the "A" state are symmetrical. In this case, in the LLR table 0, numerical values of ΔAM and ΔAP are set such that a range in which the soft bit read voltages AM1 to AM3 and AP1 to AP3 are set can include the respective distributions of TFB and BFB.

ΔAM, ΔAP, ΔBM, ΔBP, ΔCM, and ΔCP corresponding to the LLR table 1 are set to "3", "5", "3", "3", "3", and "3", respectively. That is, in the LLR table 1, the shift amount of the read voltage corresponding to the read voltage AR differs between the positive direction and the negative direction, and other settings are the same as the setting of the LLR table of "0". An example of the soft bit read voltage corresponding to the LLR table 1 and corresponding to the read voltage AR and a threshold voltage distribution is illustrated in FIG. 28.

Figure 28:
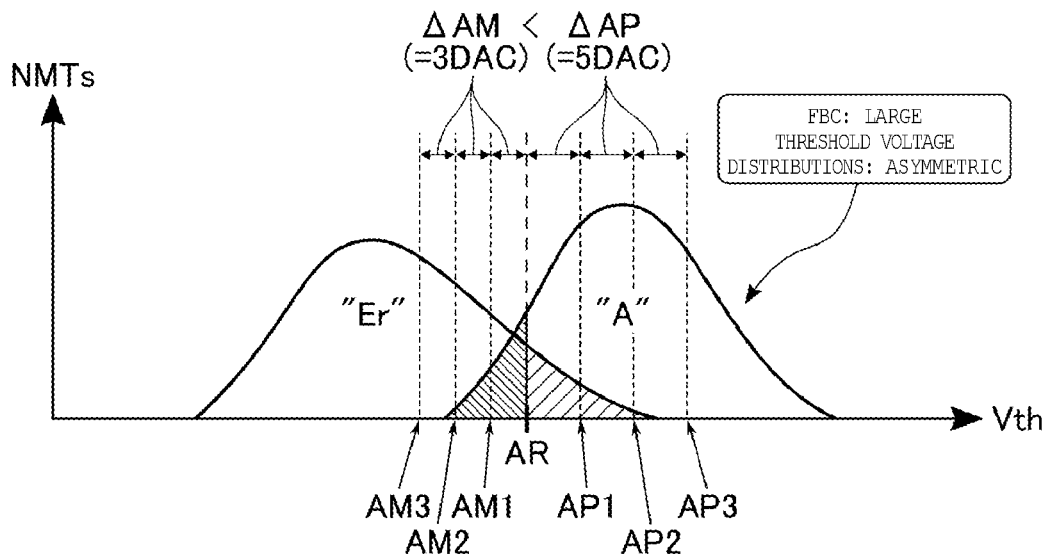
FIG. 28 is a threshold voltage distribution diagram illustrating an example of setting of the soft bit read voltage based on the LLR table in the memory system according to the second embodiment.

As illustrated in FIG. 28, in the second state associated with the LLR table 1, the threshold voltage distributions of the "Er" and "A" states are formed asymmetrically, and the fail bit count FBC between the "Er" and "A" states is large. That is, it is presumed that shapes of the respective distributions of the upper tail fail bit TFB in the "Er" state and the lower tail fail bit BFB in the "A" state are asymmetrical. When an influence of the read disturb is large, the upper tail of the threshold voltage distribution of the "Er" state has a large extension, and the distribution of the upper tail fail bit TFB tends to extend toward the "A" state. In this case, in the LLR table 1, ΔAP is set to be larger than ΔAM, and thereby, a range in which the soft bit read voltages AM1 to AM3 and AP1 to AP3 are set can include the respective distributions of TFB and BFB.

ΔAM, ΔAP, ΔBM, ΔBP, ΔCM, and ΔCP corresponding to the LLR table 2 are set to "3", "3", "3", "3", "5", and "3", respectively. That is, in the LLR table 2, the shift amounts of the read voltage corresponding to the read voltage CR are different between the positive direction and the negative direction, and other settings are the same as the setting of the LLR table of "0". An example of the soft bit read voltage corresponding to the LLR table 2 and corresponding to the read voltage CR and a threshold voltage distribution is illustrated in FIG. 29.

Figure 29:
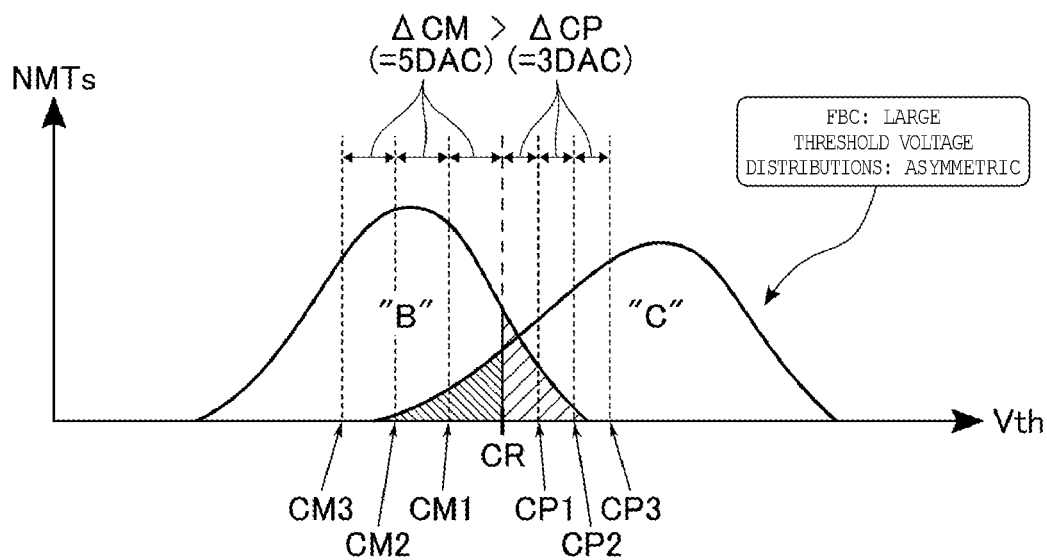
FIG. 29 is a threshold voltage distribution diagram illustrating an example of setting of the soft bit read voltage based on the LLR table in the memory system according to the second embodiment.

As illustrated in FIG. 29, in the third state associated with the LLR table 2, the threshold voltage distributions of the and "C" states are formed asymmetrically, and the fail bit count FBC between the "B" and "C" states is large. That is, it is presumed that shapes of the distributions of the upper tail fail bit TFB of the "B" state and the lower tail fail bit BFB of the "C" state are asymmetrical. When an influence of the data retention deterioration is large, a lower tail of the threshold voltage distribution of the "C" state has a large extension, and a distribution of the lower tail fail bit BFB tends to extend toward the "B" state. In this case, in the LLR table 2, ΔCM is set to be larger than ΔCP, and thereby, a range in which the soft bit read voltages AM1 to AM3 and AP1 to AP3 are set can include the respective distributions of TFB and BFB.

ΔAM, ΔAP, ΔBM, ΔBP, ΔCM, and ΔCP corresponding to the LLR table 3 are set to "3", "5", "3", "3", "5", and "3", respectively. That is, in the LLR table 3, ΔAM and ΔAP corresponding to the read voltage AR are the same as in the LLR table 1, ΔBM and ΔBP corresponding to the read voltage BR are the same as in the LLR table 0, and ΔCM and ΔCP corresponding to the read voltage CR are the same as in the LLR table 2. That is, in the LLR table 3, the respective characteristic settings of the LLR tables 1 and 2 are applied.

Each of ΔAM, ΔAP, ΔBM, ΔBP, ΔCM, and ΔCP corresponding to the LLR table 4 is set to "4". That is, in the LLR table 4, the shift amounts in the positive direction and the negative direction for each read voltage are equal to each other, and the shift amount is set to be larger than the shift amount in the LLR table 0. An example of the soft bit read voltage corresponding to the LLR table 4 and corresponding to the read voltage BR and a threshold voltage distribution is illustrated in FIG. 30.

Figure 30:
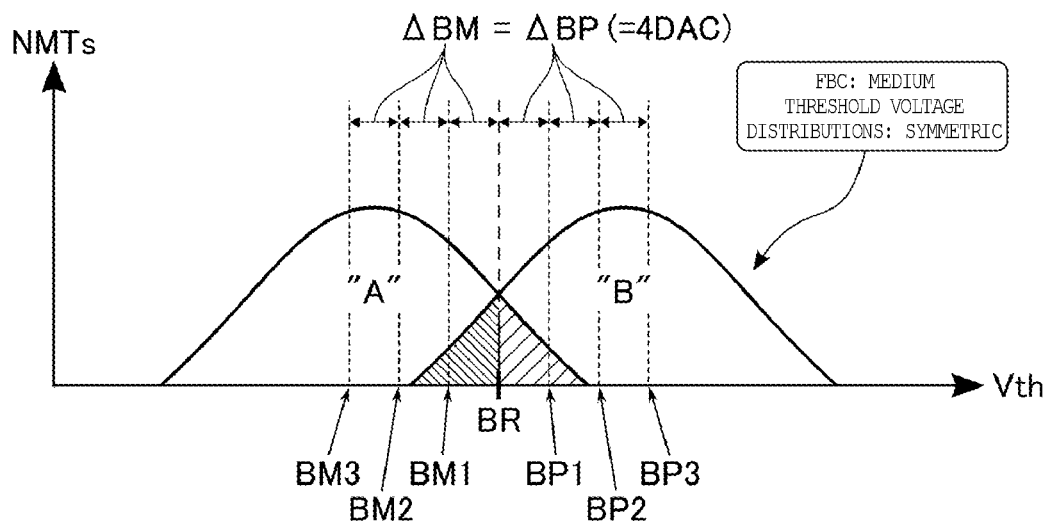
FIG. 30 is a threshold voltage distribution diagram illustrating an example of setting of the soft bit read voltage based on the LLR table in the memory system according to the second embodiment.

As illustrated in FIG. 30, in the fourth state associated with the LLR table 4, the respective threshold voltage distributions of the "A" and "B" states are formed symmetrically, and the fail bit count FBC between the "A" and "B" states is larger than the fail bit count in the first state. It is presumed that shapes of the distributions of the upper tail fail bits TFB of the "A" state and the lower tail fail bits BFB of the "B" state are symmetrical. In this case, in the LLR table 4, ΔAM and ΔAP are set to larger numerical values (for example, 4 DAC) than the LLR table 0, and thereby, a range in which the soft bit read voltages AM1 to AM3 and AP1 to AP3 are set can include the respective distributions of TFB and BFB.

As described above, in the memory system 1 according to the second embodiment, the shift amount of the soft bit read voltage is set according to the overlap between two adjacent states. The shift amount of the read voltage in each LLR table used in the above description is merely an example. The shift amount of the read voltage may be a value previously set for each LLR table and may be set to a random numerical value.

2-3 Effect of Second Embodiment

According to the memory system 1 of the second embodiment described above, performance of the soft determination decoding process can be improved. Detailed effects of the memory system 1 according to the second embodiment will be described below.

A combination of the LLR table and the soft bit read voltage used in the soft determination decoding process is determined according to an assumed shape of a cell distribution of the memory cell transistors MT. In contrast to this, the cell distribution of the memory cell transistor MT may change due to an influence of a read disturb, a data retention deterioration, or the like as described in the first embodiment. Accordingly, it is preferable that the memory system prepares a plurality of combinations of the LLR table and the soft bit read voltage in which a change is assumed and uses the combinations according to the shape of the cell distribution.

However, in the read operation for each page, the memory system can determine the fail bit count FBC in the page from the read result of the selected page, and cannot determine the fail bit count FBC generated between two adjacent states. That is, the memory system cannot determine which threshold voltage error is dominant over multiple threshold voltages from page-by-page read operations or how much the read voltage becoming an ideal voltage for the threshold value is shifted in the positive or negative direction with respect to a current set value. In short, the memory system cannot determine the shape of the cell distribution.

Accordingly, in the soft determination decoding process, the memory system cannot use a combination of the prepared LLR table and the soft bit read voltage properly. As a result, for example, a typical setting assuming a case where the threshold voltage distributions are symmetrical is generally used as the combination of the LLR table and the soft bit read voltage.

In this case, for example, the shift amounts of the read voltages in the soft bit read operation are set at equal intervals and are set equally in the positive direction and the negative direction. In a certain LLR table, the shift amounts of the read voltages in the soft bit read operation are set equally for each read voltage to be used. If such setting is applied, there is a concern that the soft determination decoding process cannot be performed sufficiently when the threshold voltage distributions change asymmetrically or when overlap between the threshold voltage distributions is different only in some states.

In contrast to this, the memory system 1 according to the second embodiment uses a combination of the LLR table associated with the stress information and the soft bit read voltage in the soft determination decoding process. That is, the memory system 1 performs the soft determination decoding process by using information on a shape of the threshold voltage distribution previously determined by the patrol operation described in the first embodiment.

For example, as a result of the long-term data retention deterioration, the shift amount of the "C" state to a low voltage side is large, and only overlap between the "B" and "C" states is considered to be different from the overlap of other adjacent states. In this case, the memory system 1 according to the second embodiment also sets the shift amounts of the soft bit read voltages asymmetrically in correspondence with a set of asymmetric "B" and "C" states. Then, the memory system 1 applies typical setting to the LLR table and the soft bit read voltage for a set of other states.

As such, the memory system 1 according to the second embodiment can change the shift amounts of the soft bit read voltages for each read voltage, and can further use asymmetric setting in the positive direction and the negative direction. That is, the memory system 1 according to the second embodiment can use an optimum combination of the LLR table and the soft bit read voltage in the soft determination decoding process.

As a result, the memory system 1 according to the second embodiment can perform the soft determination decoding process according to the shape of the threshold voltage distribution and can increase the error correction capability. Since the error correction capability is increased, the memory system 1 according to the second embodiment can prevent generation of unreadable data and can increase reliability of stored data.

The soft determination decoding process in the second embodiment described above may be performed in a retry sequence during the patrol operation described in the first embodiment. In this case, for example, in the retry sequence of step S16, the memory system 1 sequentially performs the processes of steps S30 to S33. In the soft determination decoding process performed during the patrol operation, for example, stress information acquired during a previous patrol operation is referred to.

3 Other Modification Examples and the Like

The memory system according to the embodiment includes a semiconductor storage device and a memory controller. The semiconductor storage device includes a plurality of memory cells, each storing a plurality of bits of data, and a word line connected to the plurality of memory cells. The memory controller includes a storage circuit and a control circuit. The storage circuit stores a correction value of the read voltage associated with the word line "for example, the correction value table of FIG. 10" and a plurality of tables, "for example, the LLR table of FIG. 26", corresponding to the shift amount of the read voltage to be used in a shift read, each being performed in a soft bit error correction process. The control circuit selects the word line, reads each of first page data and second page data, performs a hard bit error correction process for each of the read first and second page data, calculates the shift amount of the read voltage to be used in the next read operation in which the word line is selected, based on the read first and second page data and the first and second page data corrected by the hard bit error correction process, and performs a first process for updating the correction value based on the calculated shift amount and a second process of selecting a table to be used in the soft bit error correction process from a plurality of tables, based on the correction value when the error correction by the hard bit error correction process fails. Thereby, the memory system according to the embodiment can improve performance of the soft determination decoding process.

In the above embodiments, the correction operation of the patrol operation does not necessarily have to be performed for all the word lines WL and may be performed for at least a representative word line WL set randomly. In this case, the stress information or a correction value of the read voltage corresponding to the word line WL for which the correction operation is omitted are determined based on the result obtained by the correction operation for the representative word line WL, for example. Meanwhile, a defect detection by the patrol read is for the purpose of detecting a physical defect such as a short circuit between, for example, adjacent word lines WL and is therefore preferably performed for all the word lines WL.

In the above embodiments, when the patrol read selected by a certain word line WL is performed on a page basis, there may be both a page that is successful in error correction and a page that fails in error correction. In this case, the memory system 1 may perform a retry sequence for the page failing in error correction by using a correction value based on the correction value of the page that is successful in error correction.

In the above embodiments, a stress information table stored in the RAM 32 in the memory controller 30 may be saved in the semiconductor storage device 10 when the memory system 1 is shut down. In this case, in a booting sequence when the memory system 1 is booted, the saved stress information table is read and stored in the RAM 32. In this case, the memory system 1 can acquire the latest stress information on the page from the recovered stress information table when a retry sequence is performed in the patrol operation shortly after booting. That is, the memory system 1 can select an optimum combination of the LLR table and the soft bit read voltage even in the patrol operation shortly after the booting and can increase error correction capability of the soft determination decoding process.

In the second embodiment, a case where, in the soft bit read operation, the shift amounts of the soft bit read voltages are different in the positive direction and the negative direction and are uniform in each of the positive direction and the negative direction is described, and the present disclosure is not limited to this. For example, a width of the shift amount of the soft bit read voltage may not be uniform. The soft bit read voltage may be a voltage value used for a prior evaluation and may have an LLR value proper for a threshold voltage distribution region partitioned by the LLR table.

In the correction operation according to the above-described embodiment, the read page data and the corrected page data are temporarily stored in, for example, a buffer memory, the DRAM 20, or the like in the memory controller 30. The memory controller 30 may include a counter that counts a difference between these temporarily stored page data, that is, the fail bit count. Each operation of the memory controller 30 according to the above embodiment may be performed, for example, by performing firmware stored in a read only memory (ROM) or the like in the memory controller 30 by using the CPU 31 or may be performed by a dedicated circuit.

In the above embodiment, a case where the MLC method is applied to a data storage method is given as an example, but the present disclosure is not limited to this. For example, even when the memory cell transistor MT stores data of 1 bit or 3 bits or more, the configuration and operation described in each of the first embodiment and the second embodiment can be performed.

In the present specification, "connection" indicates that the connection is electrically made and does not exclude, for example, that another element is interposed therebetween. An "H" level indicates a voltage by which an n-channel MOS transistor is turned on and a p-channel MOS transistor is turned off. An "L" level indicates a voltage by which the p-channel MOS transistor is turned on and the n-channel MOS transistor is turned off. The "soft determination decoding process" may be referred to as including a read operation based on an LLR table.

In the above embodiments, a "command set" indicates a group of a command corresponding to a certain operation and address information. If the semiconductor storage device 10 receives a command set from the memory controller 30, the semiconductor storage device 10 starts an operation based on the command set. Each command used in the write explanation may be replaced with a certain command. The command set may be designed to have a certain configuration. For example, a command inserted before the commands "00h" and "80h" may be omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of updating correction values of read voltages during an operation to read data from a semiconductor storage device that includes a plurality of memory cells each storing a plurality of bits of data and a word line connected to the plurality of memory cells, said method comprising:
   storing correction values for read voltages in association with the word line;
   selecting the word line;
   performing a read operation to read data from the memory cells connected to the word line;
   performing a correction operation on the read data to determine a number of error bits in the data;
   determining a correction value for each read voltage used in the read operation based on the number of error bits in the data that has been read using the read voltage and a ratio of a lower tail fail bit count and an upper tail fail bit count in the data that has been read using the read voltage; and
   updating the correction values for the read voltages that are stored in association with the word line, for subsequent read operations performed on the memory cells, wherein
   the lower tail fail bit count represents the number of memory cells in a first state having threshold voltages of a second state that is adjacent to the first state, and the upper tail fail bit count represents the number of memory cells in the second state having threshold voltages of the first state.

2. The method according to claim 1, further comprising:
   prior to determining the correction value for a read voltage, determining that the number of error bits in the data is greater than a threshold or that the ratio is less than a lower limit ratio or greater than an upper limit ratio.

3. The method according to claim 2, wherein determining the correction value includes:
   selecting the correction value from a table that associates each of multiple correction values to different ratios that are each less than the lower limit ratio or greater than the upper limit ratio.

4. The method according to claim 1, wherein the data read from the memory cells include lower page data and upper page data and the read voltages include a first read voltage, a second read voltage greater than the first read voltage, and a third read voltage greater than the second read voltage.

5. The method according to claim 1, wherein
   the correction values for the first, second, and third read voltages are determined based on the number of error bits in the data that has been read using the first, second, and third read voltages, respectively, and the ratio of the lower tail fail bit count and the upper tail fail bit count in the data that has been read using the first, second, and third read voltages, respectively.

6. The method according to claim 5, wherein
   when determining the correction value for the first read voltage, the threshold voltages of the first state are each less than the first read voltage and the threshold voltages of the second state are each greater than the first read voltage and less than the second read voltage.

7. The method according to claim 5, wherein
   when determining the correction value for the second read voltage, the threshold voltages of the first state are each greater than the first read voltage and less than the second read voltage and the threshold voltages of the second state are each greater than the second read voltage and less than the third read voltage.

8. The method according to claim 5, wherein
   when determining the correction value for the third read voltage, the threshold voltages of the first state are each greater than the second read voltage and less than the third read voltage and the threshold voltages of the second state are each greater than the third read voltage.

9. A method of updating correction values of read voltages during an operation to read data from a semiconductor storage device that includes a plurality of memory cells each storing a plurality of bits of data and a word line connected to the plurality of memory cells, said method comprising:

storing a correction value of a read voltage associated with the word line and a plurality of tables each corresponding to a shift amount of a read voltage to be used for a shift read performed in a soft bit error correction process;

selecting the word line;

performing a read operation to read first page data and second page data from the memory cells connected to the word line;

performing a hard bit error correction process for each of the read first and second page data;

calculating a shift amount of a read voltage to be used in a next read operation in which the word line is selected, based on the read first and second page data and the first and second page data corrected by the hard bit error correction process;

performing a first process of updating the correction value based on the calculated shift amount; and performing a second process of selecting a table to be used in the soft bit error correction process from among the plurality of tables based on the correction value when an error correction by the hard bit error correction process fails.

10. The method according to claim 9, wherein the soft bit error correction process corresponding to the first page data includes reading the first page data, reading the second page data, and reading soft bit data by using a plurality of different voltages shifted from a read voltage used for reading the first page data, and wherein a shift amount of a read voltage in reading the soft bit data differs when referring to a first table among the plurality of tables from when referring to a second table among the plurality of tables.

11. The method according to claim 10, wherein at least a first read voltage is used in a read operation of the first page data, and wherein a shift amount of a read voltage corresponding to the first read voltage in reading the soft bit data differs between a positive direction and a negative direction.

12. The method according to claim 11, wherein a second read voltage higher than the first read voltage is further used in the read operation of the first page data, and wherein the shift amount of the read voltage corresponding to the first read voltage in reading the soft bit data is larger in the positive direction than in the negative direction.

13. The method according to claim 11, wherein a second read voltage lower than the first read voltage is further used in the read operation of the first page data, and wherein the shift amount of the read voltage corresponding to the first read voltage in reading the soft bit data is larger in the negative direction than in the positive direction.

14. The method according to claim 10, wherein the shift amount of the read voltage in reading the soft bit data is larger when referring to the second table than when referring to the first table.

15. The method according to claim 10, wherein at least a first read voltage and a second read voltage different from the first read voltage are used in a read operation of the first page data, wherein in reading the soft bit data based on the first table, the shift amount of the read voltage corresponding to the first read voltage and the shift amount of the read voltage corresponding to the second read voltage are the same, and wherein in reading the soft bit data based on the second table, the shift amount of the read voltage corresponding to the first read voltage is different from the shift amount of the read voltage corresponding to the second read voltage.

16. The method according to claim 9, wherein a controller for the semiconductor storage device updates the correction values of the read voltages independently of a command from an external host apparatus.

17. The method according to claim 9, wherein the second process is performed on a page basis.

18. The method according to claim 9, wherein the first process includes a process of counting each of the number of first memory cells corresponding to a first combination and the number of second memory cells corresponding to a second combination, based on first data calculated from the read first and second page data and second data calculated from the corrected first and second page data, wherein calculation of the shift amount of the read voltage includes determining a magnitude of the shift amount of the read voltage and a shift direction of the read voltage based on a ratio between the number of the first memory cells and the number of the second memory cells, and wherein in the first process, the correction value is updated when a numerical value of the ratio is approximately 1.

19. The method according to claim 9, wherein each of the plurality of tables includes a log likelihood ratio value, and wherein the soft bit error correction process is performed based on a result of the shift read and the log likelihood ratio value.

20. The method according to claim 19, further comprising:

storing stress information associated with the word line; and updating the stress information based on the correction value, wherein the shift amount of the read voltage and the table are selected based on the stress information.

* * * * *